United States Patent
Balakrishnan et al.

(10) Patent No.: US 10,312,151 B1
(45) Date of Patent: Jun. 4, 2019

(54) MONOLITHIC CO-INTEGRATION OF MOSFET AND JFET FOR NEUROMORPHIC/COGNITIVE CIRCUIT APPLICATIONS

(71) Applicant: International Business Machines Corporation, Armonk, NY (US)

(72) Inventors: Karthik Balakrishnan, White Plains, NY (US); Bahman Hekmatshoartabari, White Plains, NY (US); Alexander Reznicek, Troy, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/818,674

(22) Filed: Nov. 20, 2017

(51) Int. Cl.
| | |
|---|---|
| H01L 29/78 | (2006.01) |
| H01L 21/8234 | (2006.01) |
| H01L 27/085 | (2006.01) |
| H01L 29/808 | (2006.01) |
| H01L 29/66 | (2006.01) |

(52) U.S. Cl.
CPC .... *H01L 21/823487* (2013.01); *H01L 27/085* (2013.01); *H01L 29/6656* (2013.01); *H01L 29/66666* (2013.01); *H01L 29/66909* (2013.01); *H01L 29/7827* (2013.01); *H01L 29/8083* (2013.01)

(58) Field of Classification Search
CPC ......... H01L 29/66431; H01L 29/66909; H01L 29/7832; H01L 29/7827; H01L 29/7802
See application file for complete search history.

(56) References Cited

U.S. PATENT DOCUMENTS

| | | | |
|---|---|---|---|
| 5,889,298 A | 3/1999 | Plumton et al. | |
| 6,163,052 A | 12/2000 | Liu et al. | |
| 6,861,303 B2 | 3/2005 | Hao et al. | |
| 7,033,877 B2 | 4/2006 | Chaudhry et al. | |
| 7,598,547 B2 | 10/2009 | Pendharker et al. | |
| 7,772,056 B2 | 8/2010 | Miller et al. | |
| 9,076,662 B2 | 8/2015 | El-Kareh et al. | |
| 9,318,597 B2 | 4/2016 | Pala et al. | |
| 2009/0114980 A1* | 5/2009 | Pang | H01L 29/66712 257/328 |
| 2016/0035904 A1 | 2/2016 | Hisada et al. | |
| 2017/0243782 A1* | 8/2017 | Wu | H01L 21/76283 |

OTHER PUBLICATIONS

K. K. Bhuwalka et al., "A simulation approach to optimize the electrical parameters of a vertical tunnel FET," IEEE Transactions on Electron Devices, vol. 52, No. 7, 2005, pp. 1541-1547.
R. Sarpeshkar, "Analog versus digital: extrapolating from electronics to neurobiology," Neural Computation, vol. 10, No. 7, 1998, pp. 1601-1638.

* cited by examiner

*Primary Examiner* — Jae Lee
(74) *Attorney, Agent, or Firm* — L. Jeffrey Kelly, Esq.; Hoffmann & Baron, LLP

(57) ABSTRACT

Vertical MOSFET and JFET devices are incorporated on the same chip, enabling circuit designs that benefit from the simultaneous use of such devices. A fabrication method allows formation of the devices using a shared source/drain layer on a bulk semiconductor substrate.

10 Claims, 24 Drawing Sheets

MONOLITHIC CO-INTEGRATION OF MOSFET AND JFET FOR NEUROMORPHIC/COGNITIVE CIRCUIT APPLICATIONS

BACKGROUND

The present disclosure relates generally to the electrical, electronic and computer arts and, more particularly, to semiconductor chips including MOSFET and JFET structures.

The analog implementation of neural networks is beneficial for efficient, low-power operation of cognitive tasks such as pattern recognition and natural language processing. Noise and, in particular, 1/f noise is harmful to analog computation and practically poses a fundamental limit on the power and area efficiency benefits of analog circuits, including those used for neuromorphic computing. Analog-to-digital-to-analog (A/D/A) nodes to reset the noise levels have been used to address such noise issues. However, the overhead associated with this technique is significant and counters the area-efficiency of analog electronics.

Field-effect transistors include source, drain and gate structures. A biasing voltage applied across gate and source terminals allows the flow of charge carriers, namely electrons or holes, between source and drain. Flicker (1/f) noise is generally considered the dominant noise source in field-effect transistors. As transistor dimensions are shrunk to improve the array density, the flicker noise intensity increases, hence limiting the resulting signal-to-noise ratio.

Junction field-effect transistors (JFETs) are characterized by doped channel regions, p-n junctions on one or more sides of the channels, and ohmic contacts forming the source and drain regions. Metal oxide semiconductor field-effect transistors (MOSFETs) include gate electrodes that are electrically insulated from operatively associated semiconductor channels by thin layers of dielectric material. MOSFETs having n-doped source and drain regions employ electrons as the primary current carriers while those having p-doped source and drain regions use holes as primary current carriers. Vertical field-effect transistors (VFETs) have configurations wherein the current between the drain and source regions is substantially normal to the surface of the die. A vertical field-effect transistor may, for example, include a semiconductor pillar or fin having top and bottom (base might refer to a BJT) regions comprising source/drain regions, the portion of the pillar between the source/drain regions defining a channel region.

BRIEF SUMMARY

A monolithic semiconductor structure such as a chip having vertical JFET and MOSFET devices formed on the same substrate is disclosed. Fabrication of such a structure is further disclosed.

In one aspect, an exemplary method of fabricating a monolithic semiconductor structure including a vertical JFET device and a vertical MOSFET device includes obtaining a first structure including a heavily doped source/drain layer including first and second bottom source/drain regions, an isolation region electrically isolating the first bottom source/drain region from the second bottom source/drain region, a bottom electrically insulating spacer above the heavily doped source/drain layer, a top electrically insulating spacer above and parallel to the bottom electrically insulating spacer, and a sacrificial layer between the bottom and top electrically insulating spacers. First and second vertical trenches extending through the bottom and top electrically insulating spacers and the sacrificial layer are formed. Epitaxial first and second semiconductor channels and first and second channel material extensions are grown, the first (JFET) semiconductor channel being doped. The semiconductor channels of the JFET and MOSFET devices are grown within the first and second trenches such that the first semiconductor channel adjoins the first bottom source/drain region and the second semiconductor channel adjoins the second bottom source/drain region. The channel material extensions extend above the top electrically insulating spacer. Heavily doped first and second top source/drain regions are epitaxially grown, respectively, on the first and second channel material extensions. A first portion of the sacrificial layer above the first bottom source/drain region is removed and a heavily doped semiconductor gate is grown on the first semiconductor channel and between the bottom and top electrically insulating spacers. The heavily doped semiconductor gate and the first semiconductor channel have opposite conductivity types. A second portion of the sacrificial layer above the second bottom source/drain region is removed and a gate dielectric layer is formed on the second semiconductor channel between the bottom and top electrically insulating spacers. A metal gate is formed over the gate dielectric layer.

In a further aspect, an exemplary monolithic electronic structure includes a heavily doped source/drain layer including first and second bottom source/drain regions, the first and second bottom source/drain regions being electrically isolated from each other. The monolithic electronic structure further includes a vertical junction field-effect transistor including a doped first semiconductor channel, a heavily doped first top source/drain region, a heavily doped semiconductor gate adjoining the first semiconductor channel, and the first bottom source/drain region. The doped first semiconductor channel has a first conductivity type and the semiconductor gate has a second conductivity type opposite to the first conductivity type. A vertical metal-oxide-semiconductor field-effect transistor includes a second semiconductor channel, a heavily doped second top source/drain region, a gate dielectric layer adjoining the first semiconductor channel, a metal gate over the gate dielectric layer, and the second bottom source/drain region. The second top source/drain region and the second bottom source/drain region of the vertical MOSFET have the same conductivity type as the first top source/drain region and the first bottom source/drain region of the vertical JFET.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments or elements thereof can be implemented in the form of a computer program product including a computer readable storage medium with computer usable program code for performing the method steps indicated. Furthermore, one or more embodiments or elements thereof can be implemented in the form of a system (or apparatus) including a memory, and at least one processor that is coupled to the memory and operative to perform exemplary method steps. Yet further, in another aspect, one or more embodiments or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques as disclosed herein can provide substantial beneficial technical effects. By way of example only and without limitation, one or more embodiments may provide one or more of the following advantages:

Reduced noise in selected circuit regions using JFETs, such as where generated noise may be amplified;
Operational benefits of MOSFETs in selected circuit regions;
Reduced operational voltage.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a monolithic electronic device including a JFET and a MOSFET formed on the same substrate. By monolithically integrating vertical JFET and MOSFET structures as described below, circuit designers are able to use JFETs within "noise bottlenecks" (for example, areas where generated noise is amplified) and also in amplifier design while, at the same time, use MOSFETs in other circuit areas (including digital portions of mixed signal implementations), taking advantage of the wider gate voltage range of the MOSFETs as well as well-known (legacy) circuit designs/modules for MOSFETs. The vertical transistor structures reduce operation voltages compared to planar structures. Moreover, the vertical JFET structure as disclosed herein has a lower 1/f noise compared to a planar JFET on a semiconductor-on-insulator (SOI) substrate. The semiconductor/insulator interface, which inherently cannot be free of interface states, would introduce some 1/f noise in a planar JFET. In contrast, a JFET structure as disclosed below can enable essentially 1/f noise-free devices similar to bulk JFETs with deeply buried (diffused) gate junctions.

Figure 1:
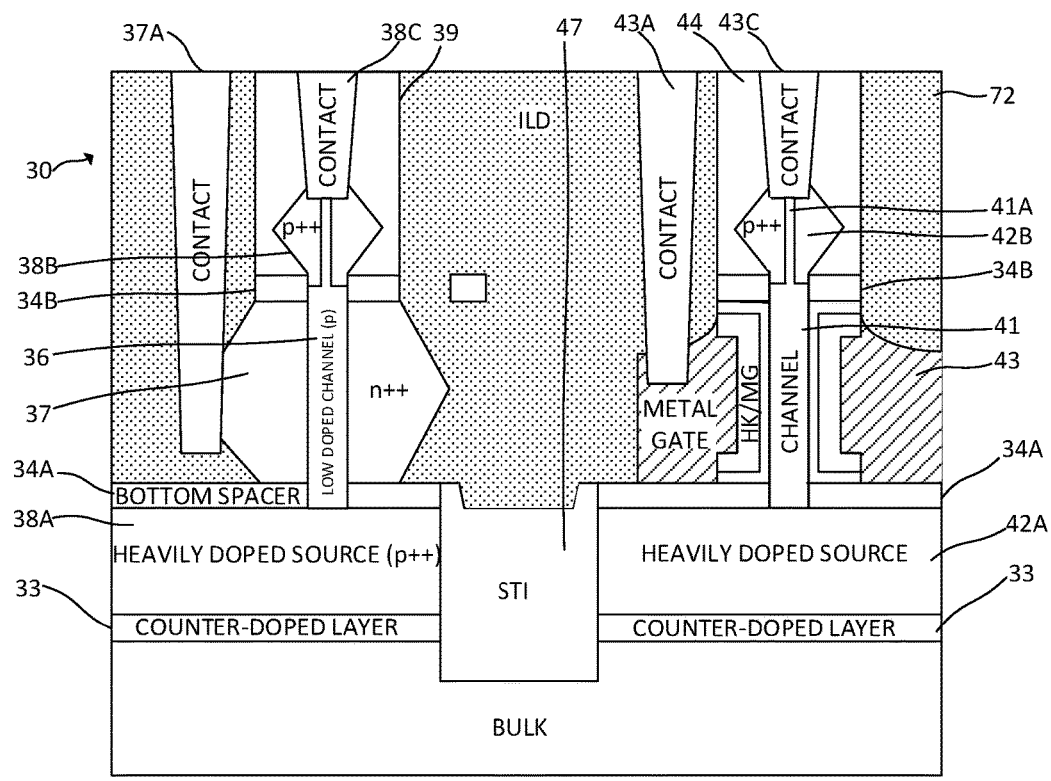
FIG. 1 is a schematic, cross-sectional view depicting an exemplary structure including a vertical JFET and a vertical MOSFET.
Figure 2:
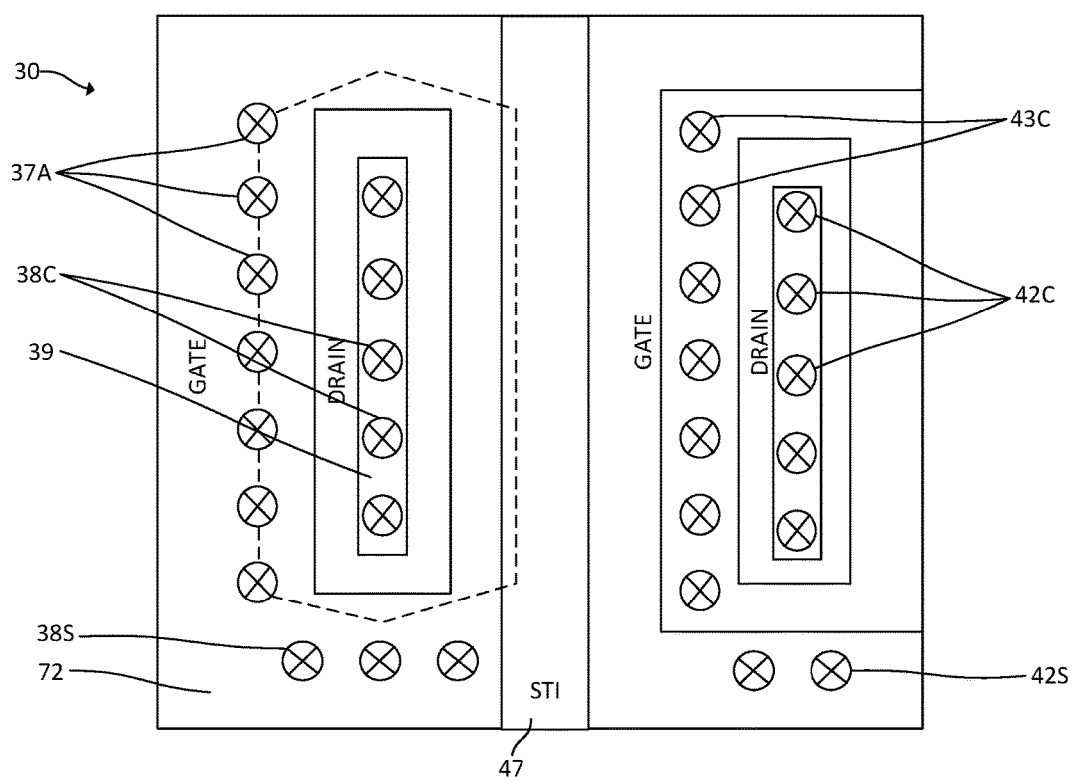
FIG. 2 is a top plan view of the structure shown in FIG. 1.

An exemplary structure 30 is shown in FIGS. 1 and 2. The electronic devices comprising the structure 30 may be incorporated within electronic circuitry that, in one or more exemplary embodiments, comprises an integrated circuit (IC). In other words, the electronic circuitry may include an assembly of electronic components, fabricated as a monolithic unit, in which active and passive devices and their interconnections are formed. The resulting circuit may perform one or more functions (e.g. logic, memory, sensing) depending on the arrangement of the components. The co-integration of vertical JFET and MOSFET devices on the same chip, as disclosed further herein, may be used for neuromorphic/cognitive circuit applications.

The JFET and MOSFET devices within the exemplary structure 30 are gate-all-around (GAA), vertical devices that can be formed during the same processing stage on a bulk semiconductor (e.g. silicon) substrate 32. It will be appreciated that the vertical devices can alternatively be formed on a semiconductor-on-insulator (SOI) substrate including a buried insulator layer. The JFET device includes a doped semiconductor channel 36, a heavily doped gate region 37 adjoining the channel, and heavily doped source/drain regions 38A, 38B. The MOSFET device includes an undoped or very lightly doped semiconductor channel 41, heavily doped source/drain regions 42A, 42B, and a gate stack including a metal gate electrode 43 surrounding the channel 41. It will be appreciated that the heavily doped regions 38A, 42A, identified as source regions in the figures can function as source regions in some embodiments and drain regions in other embodiments. The bottom source/drain region of each device is electrically isolated from the semiconductor substrate 32 by a counter-doped semiconductor layer 33 that functions as a punch-through stop (PTS). In other words, the conductivity type of the counter-doped semiconductor layer is opposite to the conductivity types of the adjoining source/drain regions. A shallow trench isolation (STI) region 47 electrically isolates the JFET device from the MOSFET device. Bottom and top spacers 34A, 34B electrically isolate the bottom and top source/drain regions, respectively, from device elements other than the channels 36, 41. Gate contacts 37A, 43A are electrically connected, respectively, to the gate regions of each device. Source/drain contacts 38C, 43C are electrically connected, respectively, to the top source/drain regions of each device. The source/drain contacts 38C, 43C are formed within vertical spacers 39, 44 that also protect the top source/drain regions of each device. The structure further includes electrically conductive contacts 38S, 43S, as schematically illustrated in FIG. 2, that are electrically connected to the bottom source/drain regions of the devices. An interlayer dielectric layer (ILD layer) 72 encapsulates the elements of the structure 30 above the bottom spacer 34A.

Figure 3:
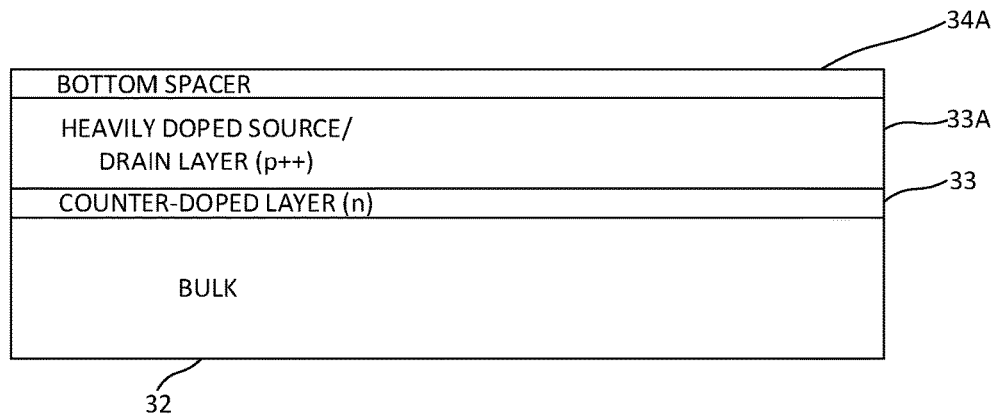
FIGS. 3-25 are schematic, cross-sectional views showing a process flow including exemplary steps for fabricating the exemplary structure shown in FIG. 1.

FIGS. 3-26 schematically illustrate a process flow for fabricating an exemplary structure 30 such as shown in FIGS. 1 and 2. Referring to FIG. 3, a first structure is obtained that includes the bulk semiconductor substrate 32, the counter-doped layer 33, a heavily doped source/drain layer 33A, and the bottom spacer 34A. The substrate 32 includes one or more semiconductor materials. Non-limiting examples of suitable substrate materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof.

The heavily doped source/drain layer 33A is arranged on the substrate over the counter-doped semiconductor layer 33. Both the heavily doped source/drain layer and the counter-doped layer can be formed by epitaxial growth on the substrate 32 as discussed further below. The heavily doped source/drain layer 33A is heavily doped with dopant(s) having a first conductivity type. The counter-doped layer 33 has a second conductivity type that is different/opposite the conductivity type of the heavily doped source/drain layer 33A. For example, when the heavily doped source/drain layer has p-type conductivity, the counter-doped layer 33 will have n-type conductivity. Conversely, when the heavily doped source/drain layer has n-type conductivity, the counter-doped layer will have p-type conductivity in order to prevent leakage current. The term "n-type" refers to the addition of impurities that contribute free electrons to an intrinsic semiconductor. In a silicon containing substrate, examples of n-type dopants, i.e. impurities, include but are not limited to antimony, arsenic and phosphorous. The term "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium.

The counter-doped layer 33 is epitaxially grown in one exemplary process and can be formed using in-situ doped epitaxy to create a layer that is functional as a punch-through stop (PTS) layer. For example, in a non-limiting illustrative example, the doping of the counter-doped layer includes arsenic (As) or phosphorous (P) for p-type and boron (B) for n-type conductivity at concentrations in the general range of $5e18/cm^3$ to $5e19/cm^3$ to stop the leakage. The thickness of the counter-doped layer 33 can be approximately 10 nm to about 100 nm.

The heavily doped source/drain layer 33A is epitaxially grown on counter-doped layer 33. The heavily doped source/drain layer 33A can be formed by a bottom-up epitaxial growth process wherein the heavily doped source/drain layer is grown to certain height (thickness) such as, but not necessarily limited to from about 50 nm to about 250 nm, with about 100 nm to about 200 nm preferred. The epitaxially grown source/drain layer 33A can be doped in situ, and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $e20/cm^3$ to $e21/cm^3$, with $4e20/cm^3$ to $8e20/cm^3$ preferred. The source/drain layer 33A can include, but is not necessarily limited to, silicon (Si), silicon germanium (SiGe), or other semiconductor material.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing semiconductor layers described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE).

By "in-situ" it is meant that the dopant that dictates the conductivity type of doped layer is introduced during the process step, e.g., epitaxial deposition, that forms the doped layer.

The bottom spacer 34A may comprise an electrically insulating material, for example, silicon dioxide, silicon nitride, SiOCN, or SiBCN. Other non-limiting examples of materials for the bottom spacer include dielectric oxides (e.g., silicon oxide), dielectric nitrides (e.g., silicon nitride), dielectric oxynitrides, or any combination thereof. The bottom spacer 34A may have a thickness of about five to about ten nanometers, though such a range is not considered critical. The bottom spacer 34A can be deposited using directional deposition techniques including, but not necessarily limited to high density plasma (HDP) deposition and gas cluster ion beam (GCIB) deposition, or deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering.

Figure 4:
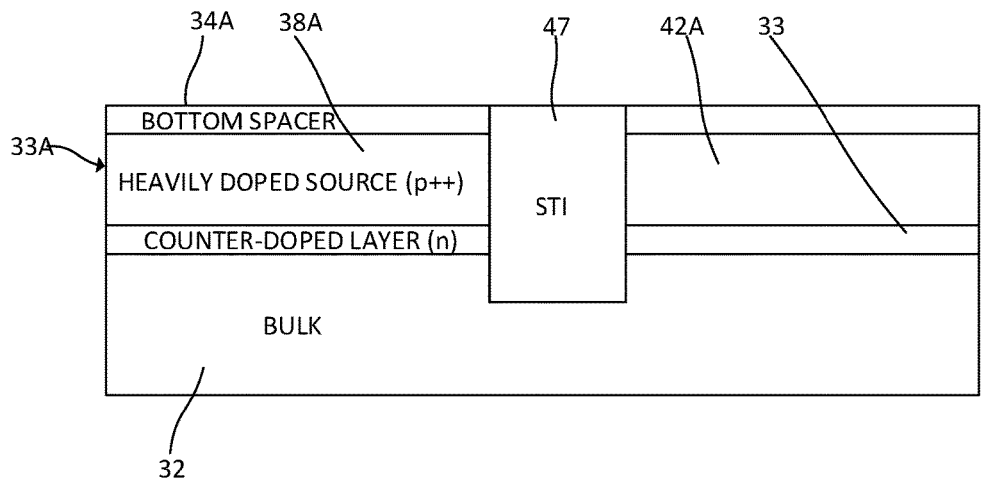

Referring now to FIG. 4, a shallow trench isolation (STI) region 47 is formed in the first structure 45. Shallow trench isolation (STI) is a process used in semiconductor fabrication for isolating FET structures. It generally involves forming trenches around FET structures, for example by etching the substrates on which the FET structures are formed and filling the trenches with an insulating material such as amorphous silicon dioxide. Patterning techniques familiar to those in the art facilitate trench formation and subsequent filling of the trench with an electrically insulating material. The STI region 47 shown in FIG. 4 extends through the bottom spacer 34A, the heavily doped source layer 33A, the counter-doped layer 33, and partially within the substrate 32. The filling process can be done by any suitable and preferably low-temperature deposition process (e.g., by CVD, spin-on) followed by removal of the oxide from areas other than the STI region. CMP (chemical mechanical planarization) to the top surface of the bottom spacer or an etch-back process can be employed to remove excess oxide from the structure. The shallow trench isolation (STI) process provides electrically isolated active areas of the structure on which the JFET and MOSFET devices are subsequently formed. Portions of the heavily doped source layer 33A, once electrically isolated by the STI region 47, comprise source/drain regions 38A, 42A of the JFET and MOSFET devices.

Figure 5:
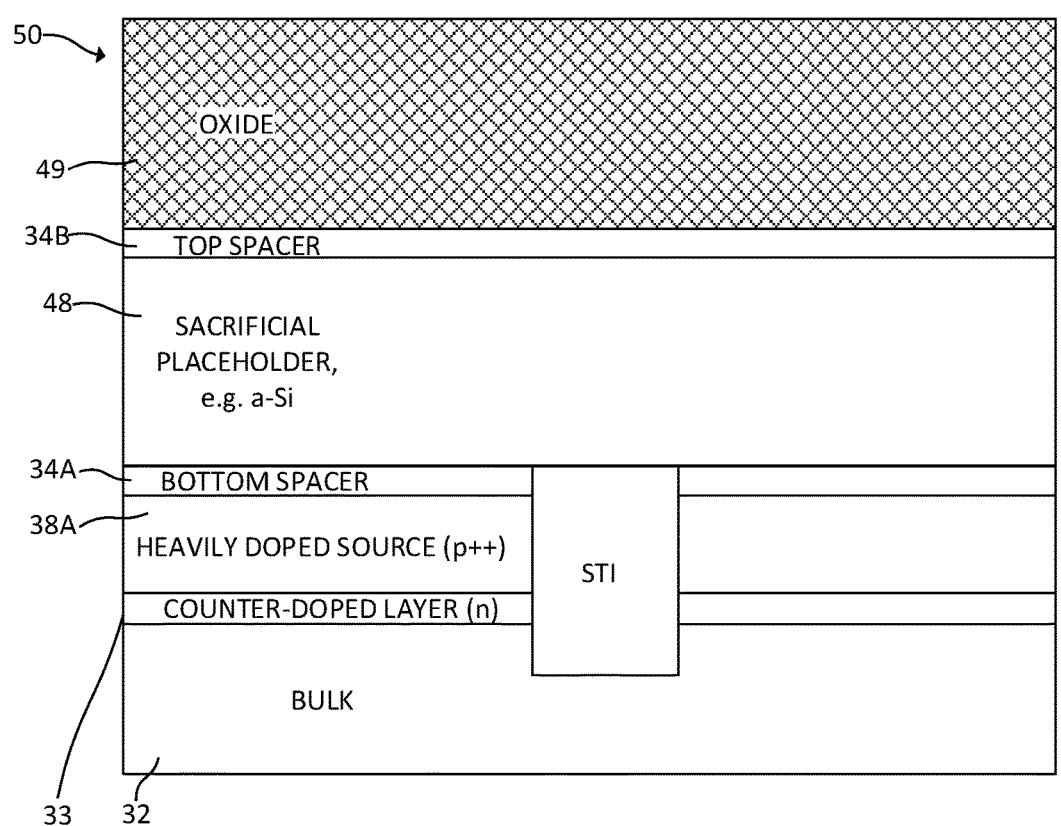

Referring the structure 50 shown in FIG. 5, a sacrificial placeholder layer 48, the top spacer 34B and an oxide layer 49 are deposited, respectively, on the structure shown in FIG. 4 to form the structure 50. The sacrificial placeholder layer includes a sacrificial gate material, for example, amorphous silicon (a-Si) or polycrystalline silicon (polysilicon). The sacrificial material may be deposited by a deposition process such as, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. Hydrogenated amorphous silicon is typically deposited by plasma-enhanced chemical vapor deposition (PECVD) although other techniques such as hot-wire chemical vapor deposition (HWCVD) may be used. The sacrificial material forming the sacrificial layer 48 has a thickness of about ten to thirty nanometers, though smaller and greater thicknesses may be employed depending on the length of the channels and associated gates to be formed during fabrication of the JFET and MOSFET devices. The top spacer 34B is deposited as a blanket layer and, in some embodiments, has the same composition and thickness as the bottom spacer 34A. Non-limiting examples of materials for the oxide layer 49 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide layer has a thickness in a range from about fifty to one hundred nanometers in some embodiments, though such a thickness range is not considered critical.

Figure 6:
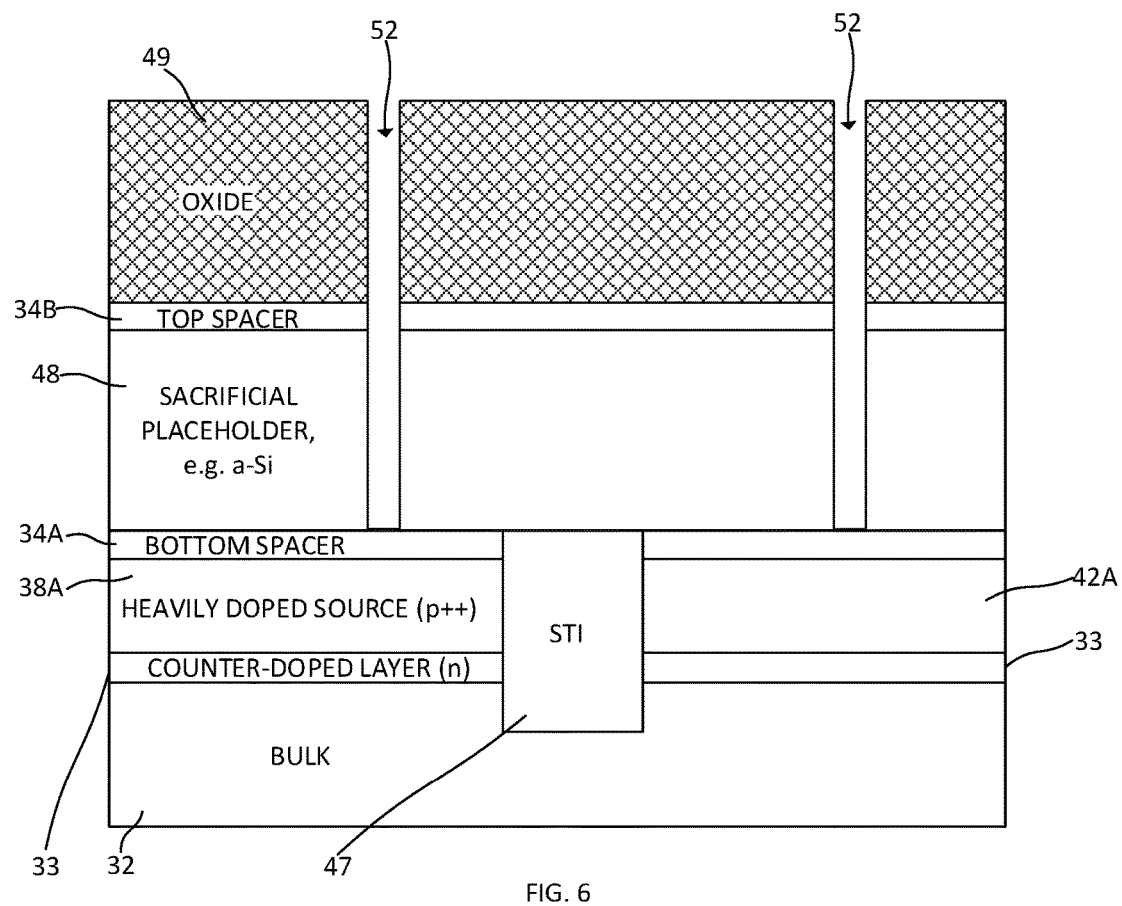

FIG. 6 is a cross-sectional side view of the structure 50 after forming trenches 52 through the oxide layer 49, the top spacer 34B, and the sacrificial placeholder layer 48 to expose the bottom spacer 34A. The trenches extend from the top surface of the oxide layer to the top surface of the bottom spacer. The trenches are formed by performing an etch process that is selective to (will not substantially remove) the bottom spacer material. A patterned mask (not shown) having openings corresponding to the trench locations is formed on the top surface of the oxide layer 49. The mask protects the remainder of the structure. The etch process may be, for example, a reactive ion etch. Multiple etching processes are performed to form the vertical trenches 52 within the structure. For example, a first etching process is performed to remove a portion of the oxide layer selective to the material of the top spacer 34B. A second etching process is then performed to remove portions of the top spacer 34B, thereby extending the trenches formed using the first etching process. A third selective etching process is then performed to extend the trenches through the sacrificial placeholder layer 48, stopping at the bottom spacer 34A. The resulting trenches 52 extend from the top surface of the oxide layer to the top surface of the bottom spacer 34A. The width of each trench 52 may be about five to ten nanometers, though other widths are possible depending on device specifications. The depth of each trench 201 may be about one hundred to two hundred nanometers, also depending in part on transistor device specifications. The width of each trench may or may not be the same.

Figure 7:
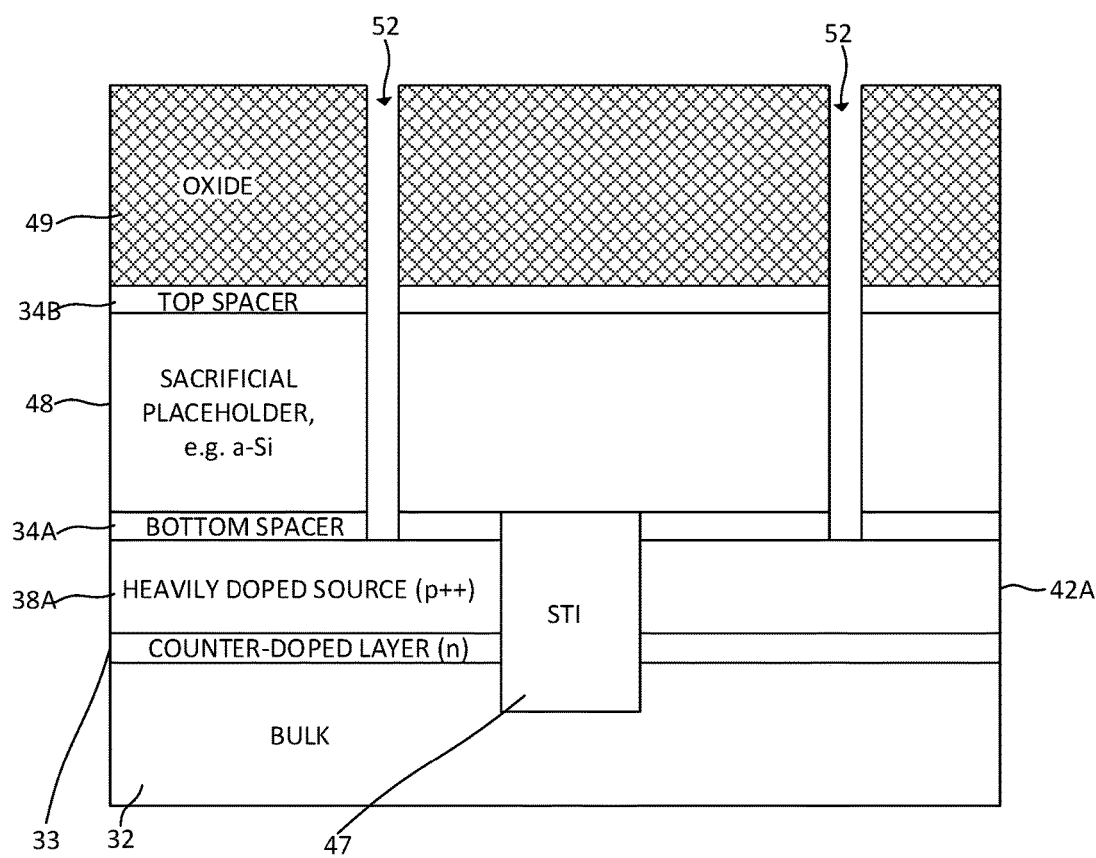

FIG. 7 is a cross-sectional side view after extending the trenches 52 through the bottom spacer 34A to expose the heavily doped source layer 33A and form self-aligned junctions. The bottom spacer may etched using a process that is selective to (will not substantially remove) the heavily doped source layer material. A reactive ion etch (ME) may be employed to expose portions of the heavily doped source layer 33A. This creates self-aligned junctions because source extensions can be epitaxially grown from the source layer to a top surface of the bottom spacer 34A.

Figure 8:
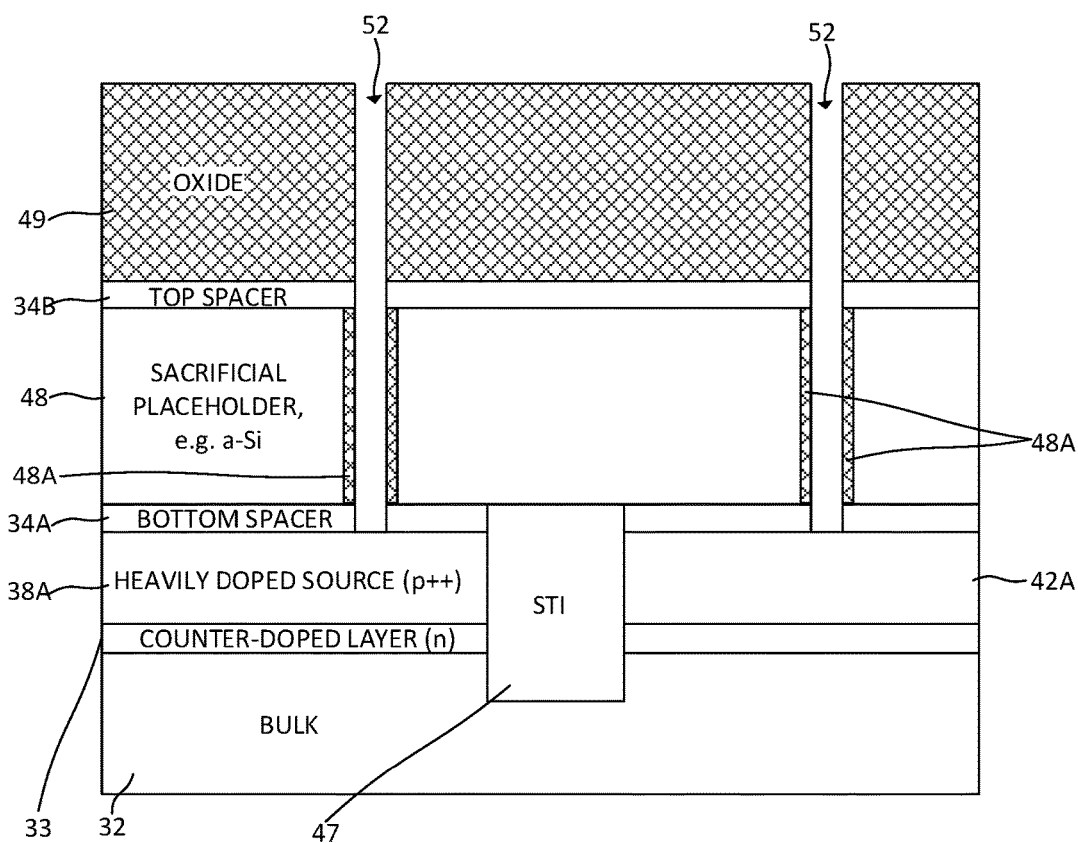

FIG. 8 is a cross-sectional side view of the structure after oxidizing exposed portions of the sacrificial placeholder layer 48 bounding the trenches 52. Thin layers of oxide 48A are formed along the trench sidewalls. The oxidation may be performed by a plasma oxidation process or other oxidation process that forms a thin oxide layer. Portions of the bottom spacer and the heavily doped source layer also may be oxidized. Any oxide formed in these regions is removed before subsequent epitaxial growth within the trenches is commenced later in the process.

Figure 9:
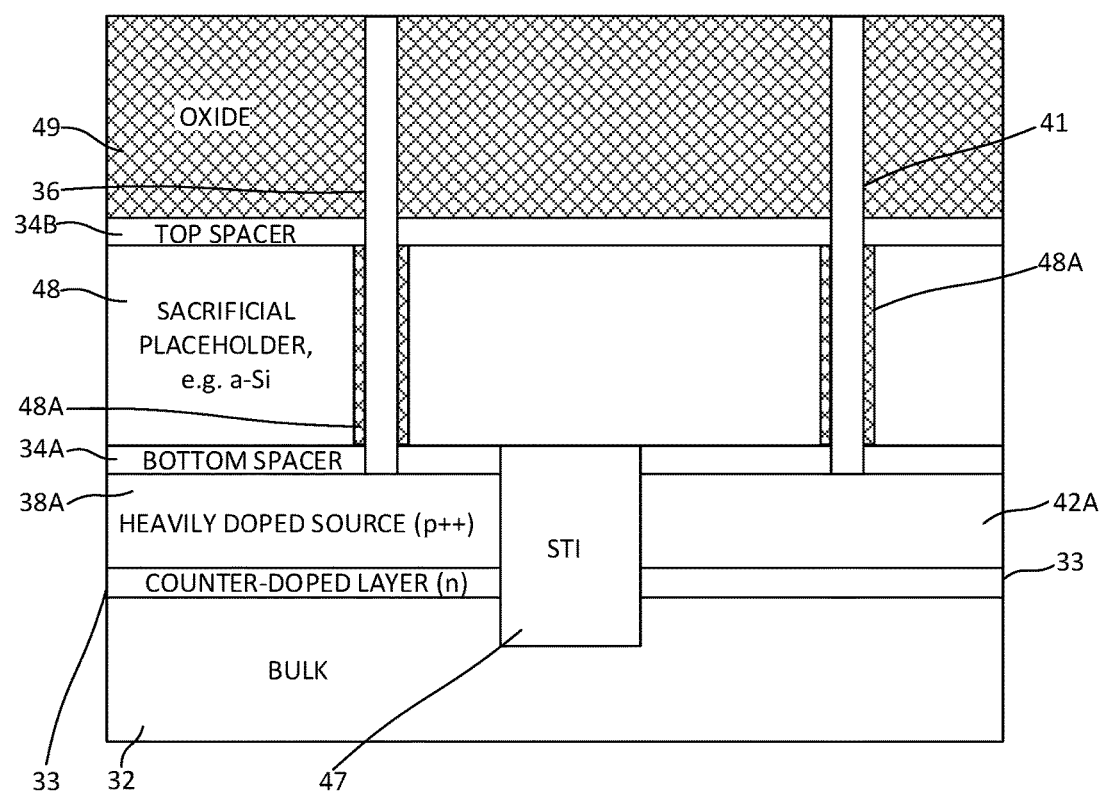

FIG. 9 is a cross-sectional side view after growing epitaxial semiconductor layers on the source/drain regions 38A, 42A after removing any unwanted oxide that may have been formed thereon. The epitaxial semiconductor layers later respectively form the epitaxial channels 36, 41 of the JFET and MOSFET devices discussed above with reference to FIGS. 1 and 2. The epitaxial process to grow each channel is selective to formation on the exposed surface of the source/drain regions 38A, 42A, and do not grow on other surfaces such as the oxide layers 48A or the spacers. The thin oxide layers 48A prevent lateral growth of the channel material, allowing epitaxial growth of the channels in a bottom-up process from the source/drain regions 38A, 42A. The epitaxial growth of the JFET and MOSFET semiconductor channels, respectively, can be performed utilizing any well-known precursor gas or gas mixture. Carrier gases like hydrogen, nitrogen, helium and argon can be used. Channel materials can include, but are not necessarily limited to silicon (Si) and silicon germanium (SiGe). The epitaxially grown layer used to form the JFET channel 36 can be doped in situ during epitaxial growth. The MOSFET channel 41 is essentially undoped or only lightly doped (e15/cm3 range). According to one exemplary embodiment, the JFET channel 36 includes low p-type doped silicon and forms a P-JFET channel. Dopant concentration of the JFET channel may be in the range of about $1e16/cm^3$ to about $1e19/cm^3$, with the range of about $1e17/cm^3$ to about $1e19/cm^3$ being preferred. The JFET channel and the MOSFET channel are grown separately to allow formation of a doped JFET channel and an essentially undoped MOSFET channel. The epitaxial growth of channel material extends over the top surface of the oxide layer 49; such overgrowth may be removed by chemical mechanical polishing (CMP) to form the planarized structure illustrated in FIG. 9. A bottom junction may be formed in the region within the bottom spacer 34A by dopant diffusion from the source/drain region 42A into the channel material of the MOSFET device. It will be appreciated that the processes described herein can be employed to form N-JFET and N-MOSFET (NFET) devices as well as P-JFET and P-MOSFET (PFET) devices.

Figure 10:
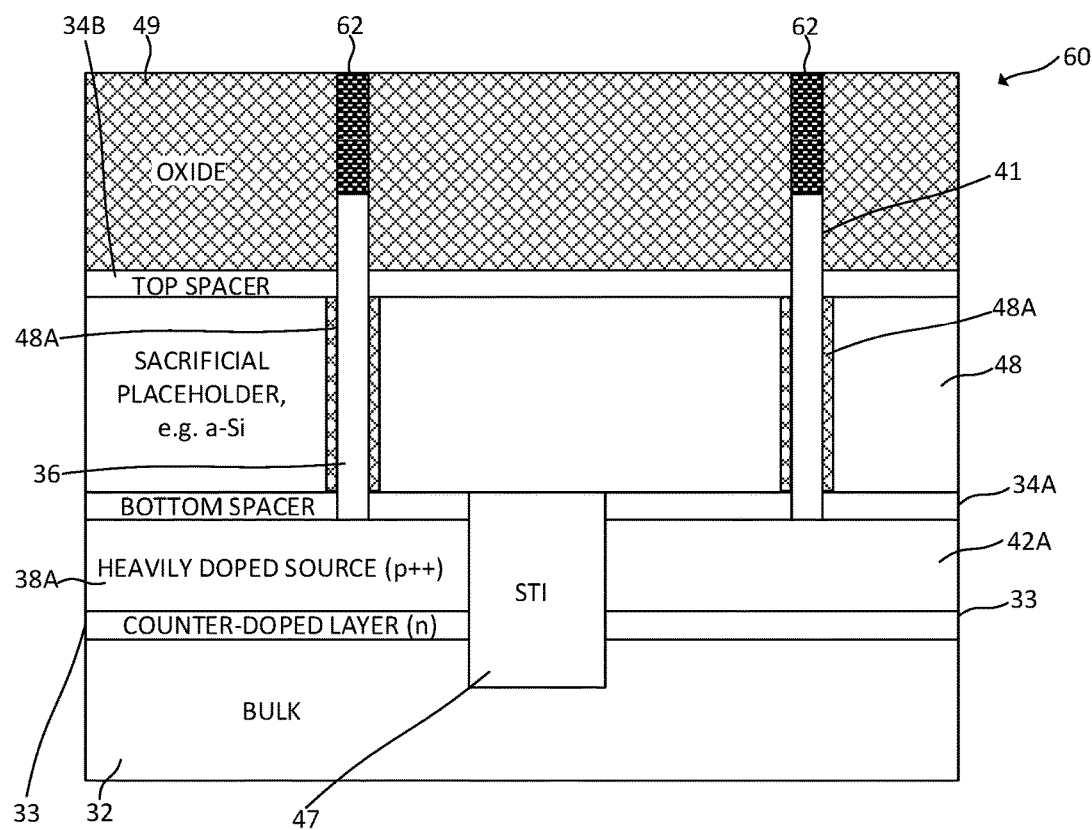

FIG. 10 is a cross-sectional side view of a structure 60 after partially recessing the channels 36, 41, filling with a dielectric material, and planarizing the top surface of the structure. The channels are partially recessed to levels that are still within the oxide layer 49 by etching, for example, by a reactive ion etch or a wet etch process. The recesses formed over the channels are filled with a dielectric material such as a dielectric oxide (e.g., silicon oxide), a dielectric nitride (e.g., silicon nitride), a dielectric oxynitride, or any combination thereof. The dielectric material is deposited using, for example, chemical vapor deposition (CVD) or physical vapor deposition (PVD). After deposition, the top surface of the structure 60 is planarized. The dielectric material directly above the channels 36, 41 forms dielectric caps 62.

Figure 11:
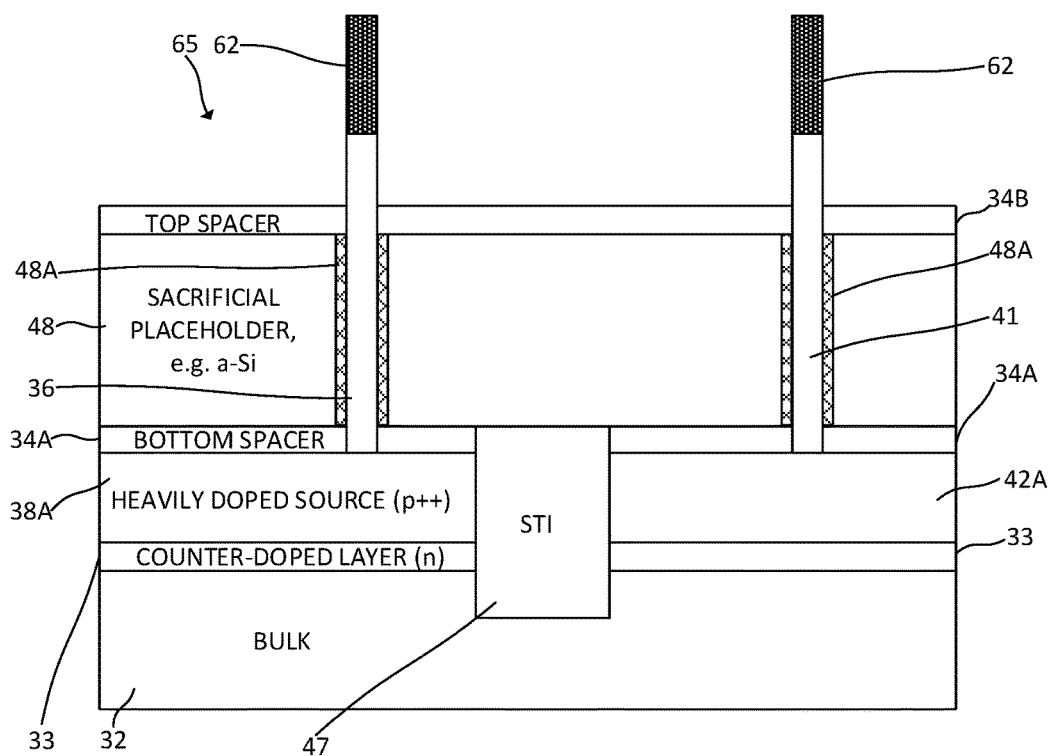

The oxide layer 49 is selectively removed to obtain a structure 65 as schematically illustrated in FIG. 11. Channel material extensions, which do not function as channels in the field-effect transistors completed later in the process, extend above the top spacer 34B and provide sufficient surface area for subsequent epitaxial growth of source/drain material thereon. The channel material extensions above the top spacer 34B are then optionally subjected to a selective lateral etch to reduce the widths thereof. An HCl gas etch may, for example, be employed. Relatively thin top semiconductor channel material extensions 36A, 41A having substantially vertical side walls are accordingly provided between the top spacer 34B and the bottoms of the dielectric caps 62 and are integral with the wider channels 36, 41. Etching of the channel material may further remove some of the semiconductor material within the top spacer 34B. In an exemplary embodiment, the relatively thin first and second channel material extensions 36A, 41A have widths between two and four nanometers (2-4 nm).

Doped epitaxial layers are grown on the top channel extensions 36A, 41A forming source/drain regions 38B, 42B having the same conductivity type as the previously formed source/drain regions 38A, 42A. The same epitaxial processes described above may be employed for forming these regions while limiting temperature to below 500° C. The doping levels of the source/drain regions 38A, 38B, 42A, 42B are substantially the same in some embodiments and can have the same chemical compositions. In some embodiments, the doped source/drain regions 38B, 42B consist essentially of boron-doped silicon. The source/drain regions 38A, 42A form faceted, diamond-shaped structures bound by <111> planes in some embodiments that are inherent to epitaxial growth of silicon-containing semiconductor material on the exposed sidewall surfaces of the relatively thin channel extensions 36A, 41A that are also silicon-containing. The deposited layer forming the source/drain regions 38B, 42B may be doped or partially doped in situ or doped following deposition. Implantation and diffusion doping are two exemplary doping techniques that can be employed in place of or supplemental to in situ doping. A structure 70 as shown in FIG. 12 is accordingly obtained.

Figure 12:
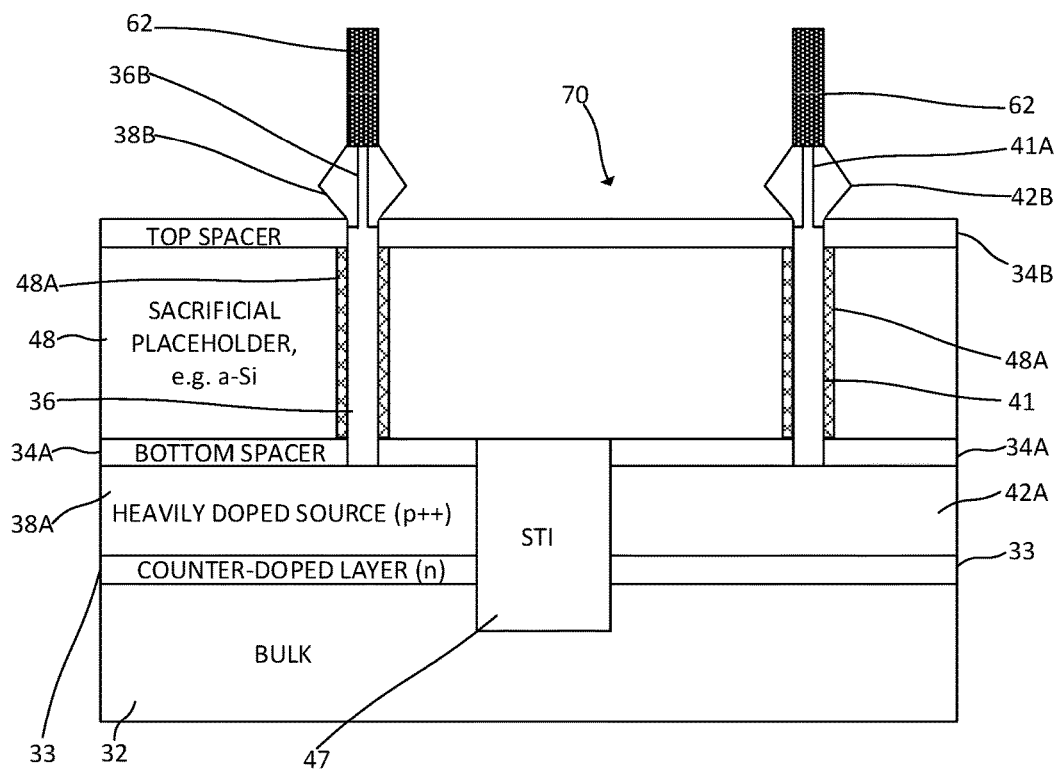
Figure 13:
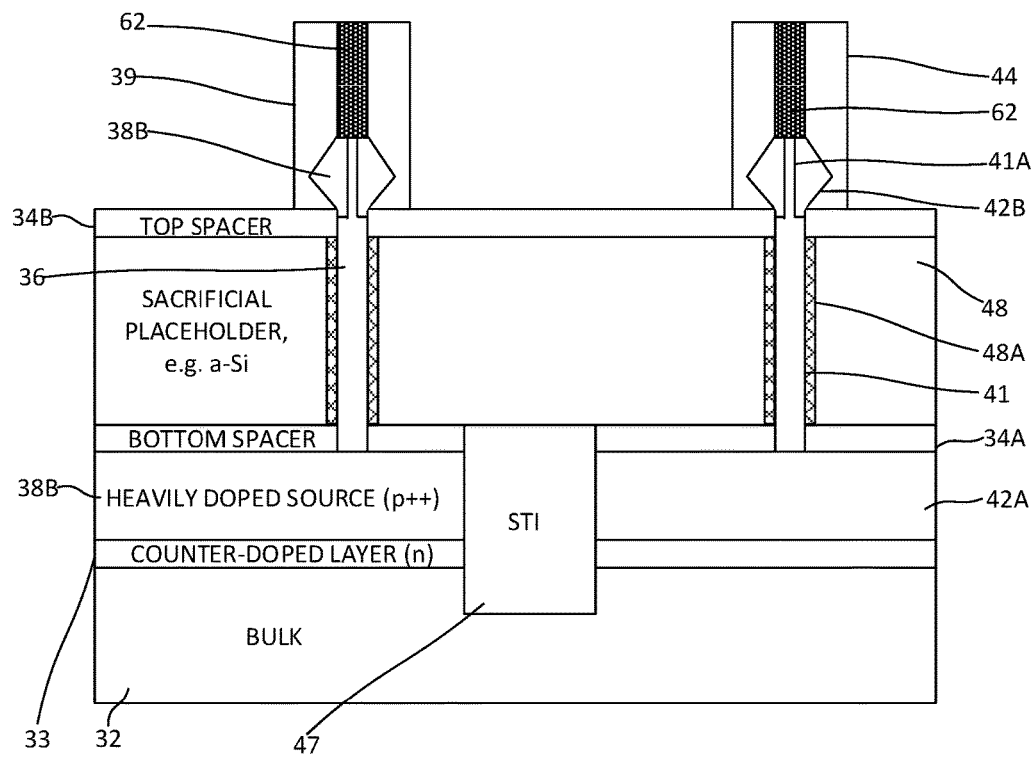

FIG. 13 illustrates the structure of FIG. 12 following formation of the vertical spacers 39 that protect the source/drain regions 38B, 42B. The spacers 39 are also disposed on the sidewalls of the dielectric caps 62. The spacers 39 are formed from an electrically insulating material, for example, dielectric oxides (e.g., silicon oxide), dielectric nitrides (e.g., silicon nitride), dielectric oxynitrides, or any combination thereof. The material chosen should allow etching of the dielectric caps selective to the spacers 39 to facilitate contact formation. The spacer material may be deposited as a blanket layer using chemical vapor deposition (CVD) or physical vapor deposition (PVD). The layer of spacer material can then be patterned using a dry etch process, for example, a RIE process, such that it covers the source/drain regions and is elsewhere removed down to the top horizontal spacer 34B, which functions as an etch stop.

Figure 14:
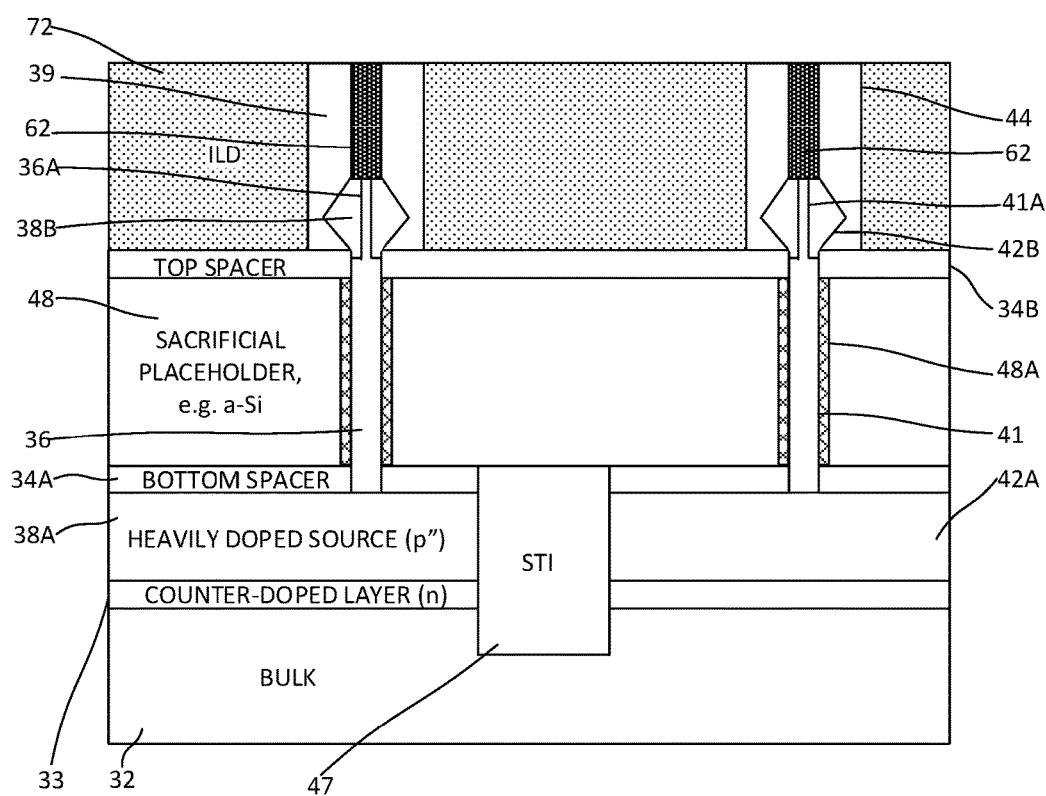

An interlayer dielectric (ILD) layer 72, for example silicon dioxide or a low-k dielectric such as SiOCH, can be formed on the structure using CVD or other known techniques. The ILD layer 72 may be formed from other dielectric materials, including but not limited to, spin-on-glass, a flowable oxide, a high density plasma oxide, borophosphosilicate glass (BPSG), or any combination thereof. The ILD layer is deposited by any suitable deposition process, including, but not limited to CVD, PVD, plasma-enhanced CVD, atomic layer deposition (ALD), evaporation, chemical solution deposition, or like processes. The ILD layer is planarized using chemical mechanical planarization (CMP), as known in the art, to obtain a structure as schematically illustrated in FIG. 14. The top surfaces of the dielectric caps 62 and adjoining spacers 39 are exposed following CMP. (ILD layers are deposited and removed during the fabrication process; numeral 72 has been employed to designate ILD layers that may appear in the various figures, it being appreciated that the ILD layers designated in subsequent figures may or may not be the same ILD layers as shown in previous figures.)

Figure 15:
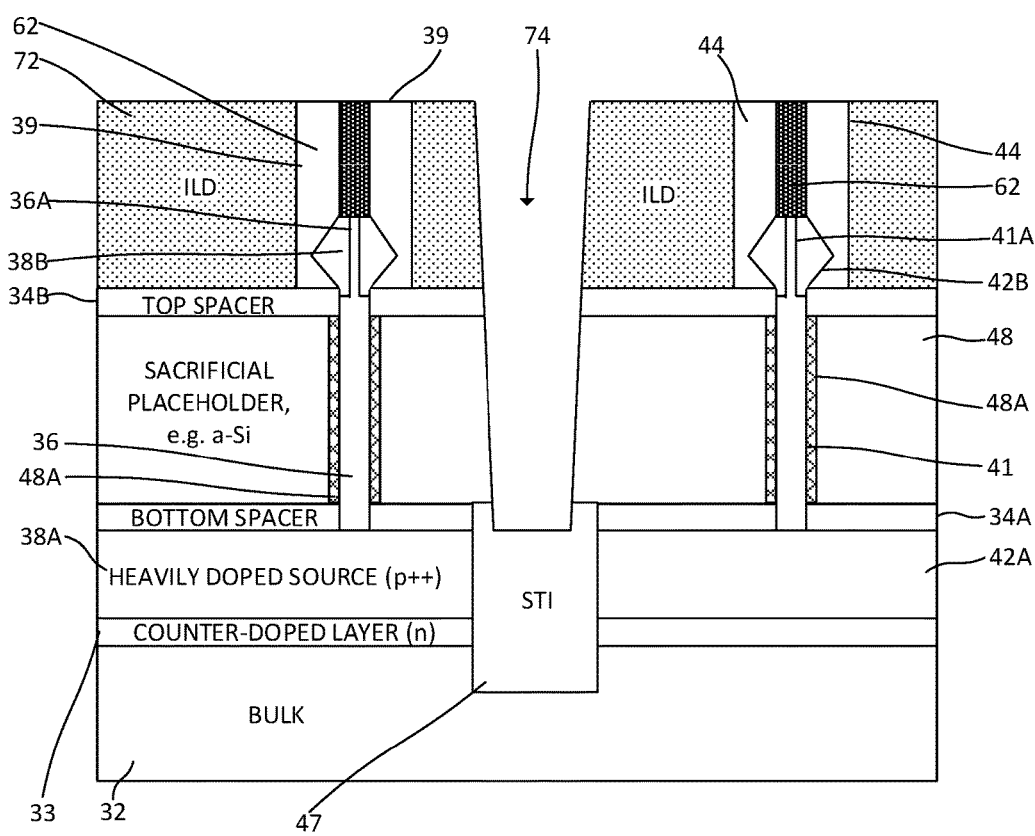
Figure 16:
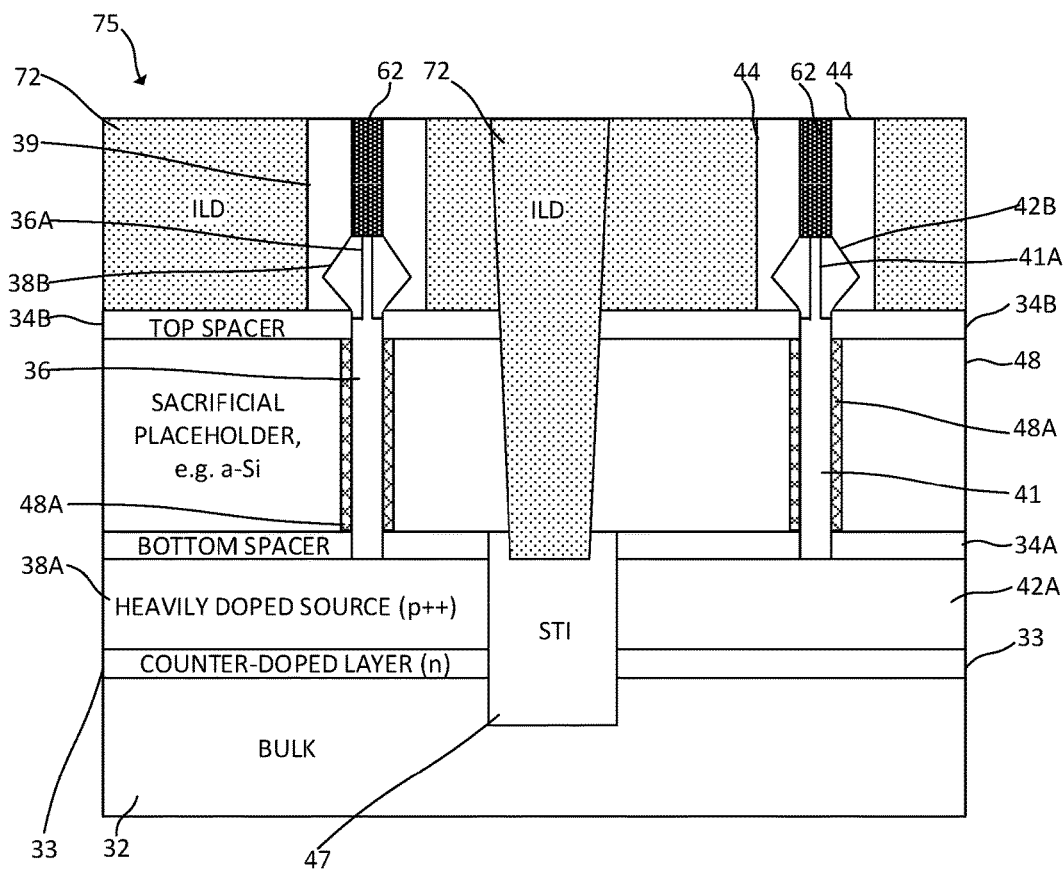

A mask (not shown) is formed on the ILD layer 72 and patterned. The ILD layer, the top horizontal spacer 34B, and the sacrificial placeholder layer 48 are subjected to etching (for example, a reactive ion etch, a wet etch, or a combination of both) down to the STI region 47. As shown in FIG. 15, the recess 74 formed within these layers extends to the center portion of the STI region 47. The width of at least the bottom end of the recess 74 is less than the width of the STI region 47. The center portion of the STI region may be partially removed during the etching process while the adjoining portions remain intact. The recess 74 is then filled with ILD material to obtain the structure 75 shown in FIG. 16.

Figure 17:
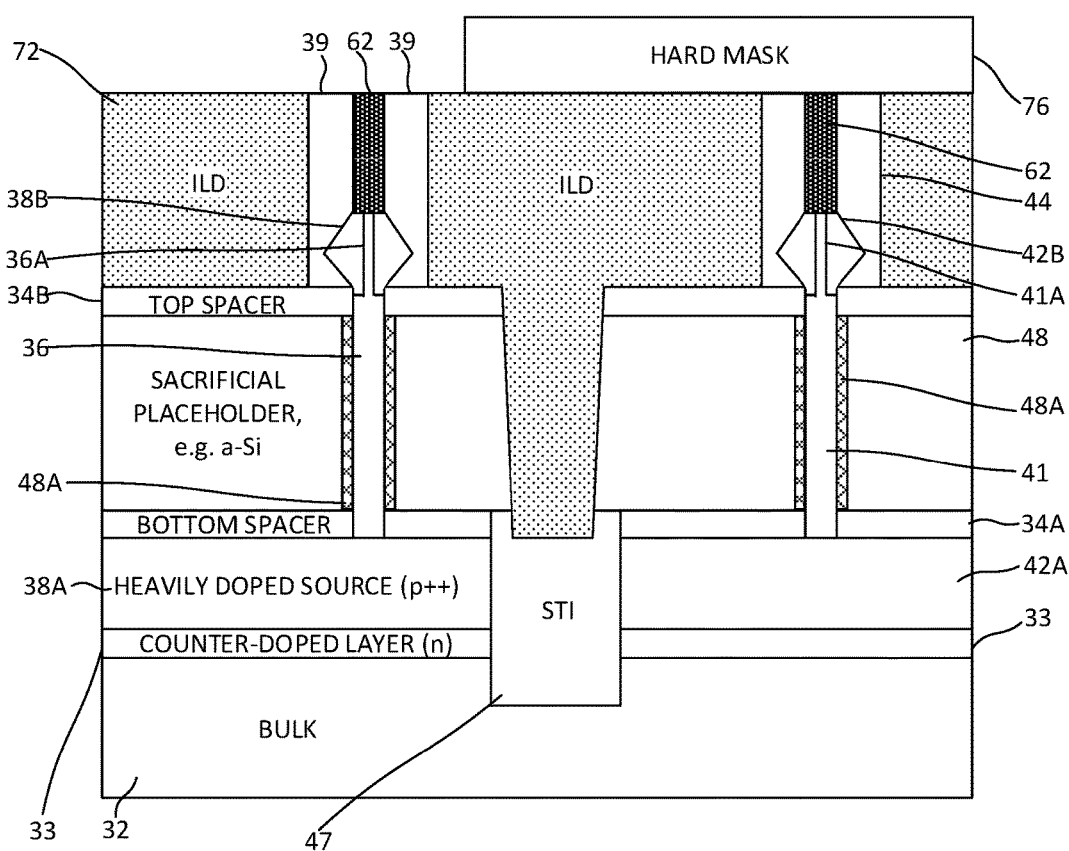
Figure 18:
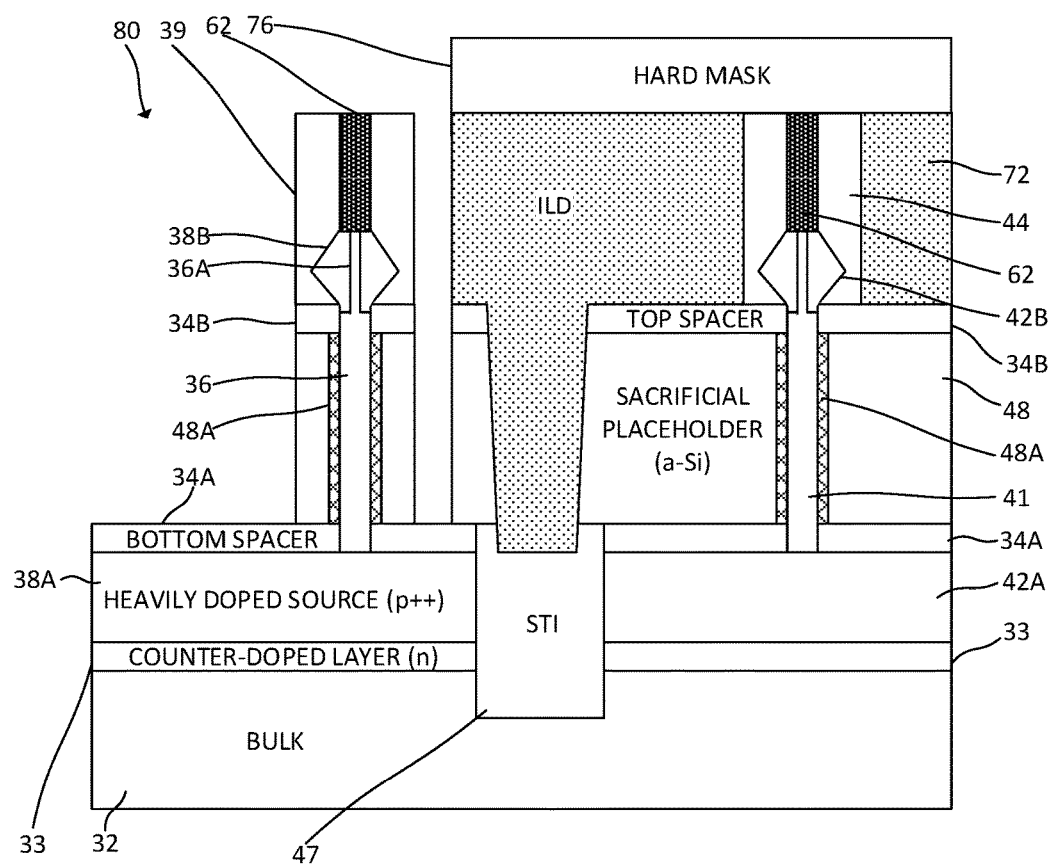

A hard mask 76 is deposited on the top surface of the structure 75 and patterned to expose the region to be used for JFET fabrication while protecting the region to be used for completing MOSFET fabrication. The hard mask, for example a silicon nitride layer, also extends over the STI region 47 as shown in FIG. 17. The regions of the ILD layer, the top spacer 34B, and the sacrificial placeholder layer 48 above the region to be used for JFET fabrication are removed by RIE, stopping at the bottom spacer 34A. The vertical spacers 39 protecting the JFET source/drain region 38A also effectively functions as a mask during the RIE process(es). A structure 80 as schematically illustrated in FIG. 18 is obtained. The portion of the sacrificial placeholder layer 48 in the JFET region is then removed to obtain the structure illustrated in FIG. 19. In embodiments where the sacrificial placeholder layer 48 consists essentially of amorphous silicon, a wet etch using hot ammonia can be used to selectively remove the desired portion thereof, leaving the spacers 39, 34A, the oxide layer 48A, the STI region 47 and the ILD material substantially intact.

Figure 20:
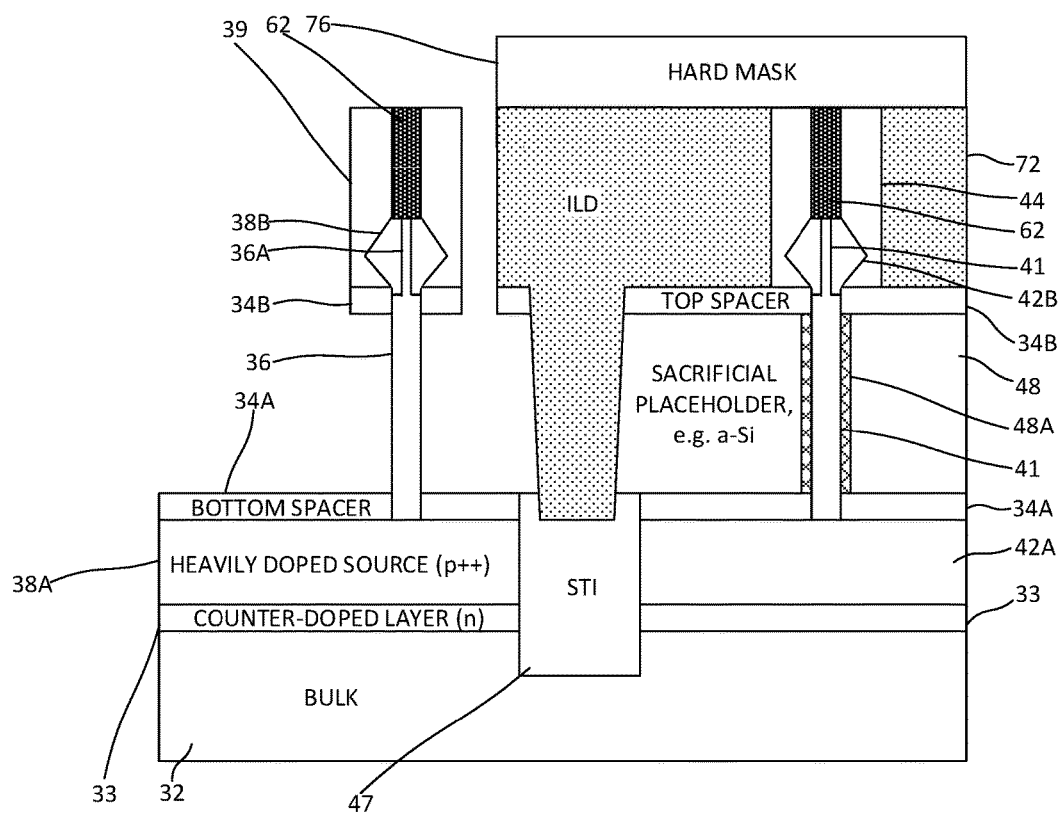

The oxide layer 48A protecting the channel 36 sidewall in the JFET region is removed as shown in FIG. 20 to expose channel 36 surfaces comprising <110> planes. The exposed surfaces of the channel can be cleaned using a SiCoNi™ etch, an in-situ HCl etch, or any other suitable pre-clean process wherein temperatures are maintained below about 800-850° C. Pre-cleaning is conducted for five minutes or less. A SiCoNi™ etch is a plasma-assisted dry etch process that involves simultaneous exposure of a substrate to hydrogen, $NF_3$ and $NH_3$ plasma by-products. This is followed by the epitaxial growth of heavily doped semiconductor material on the channel 36 sidewalls to form the gate 37 of the JFET.

Figure 21:
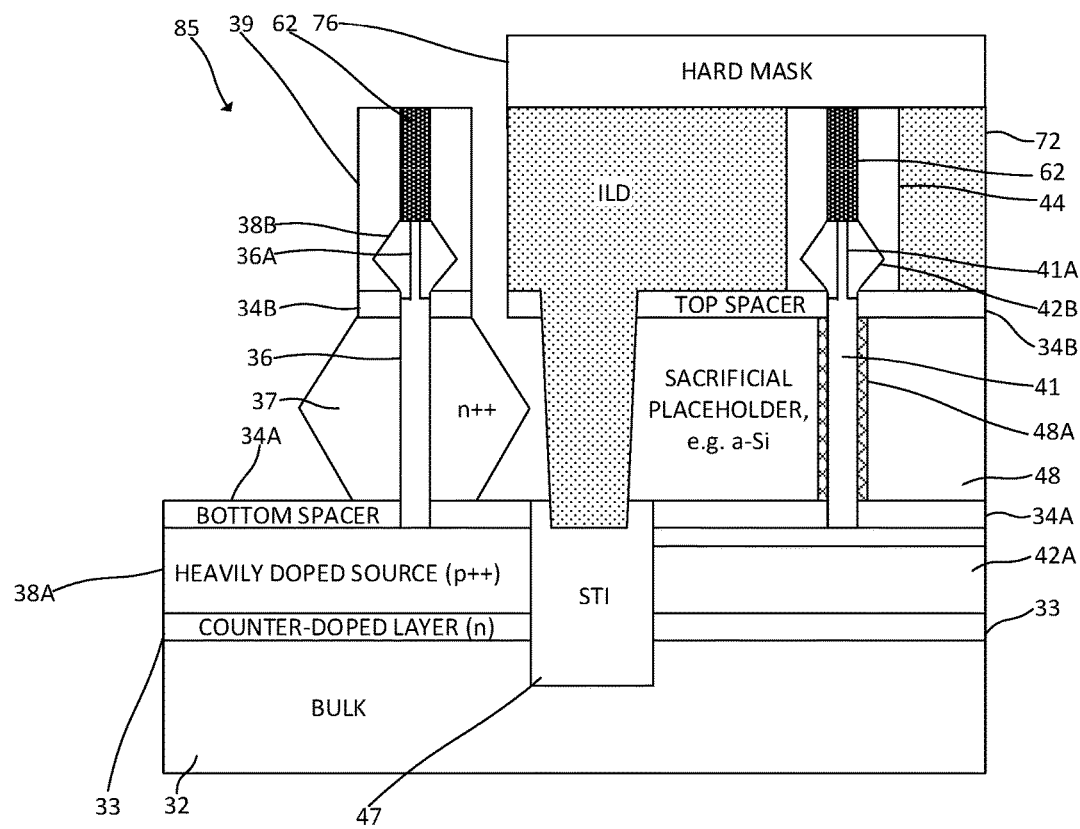
Figure 22:
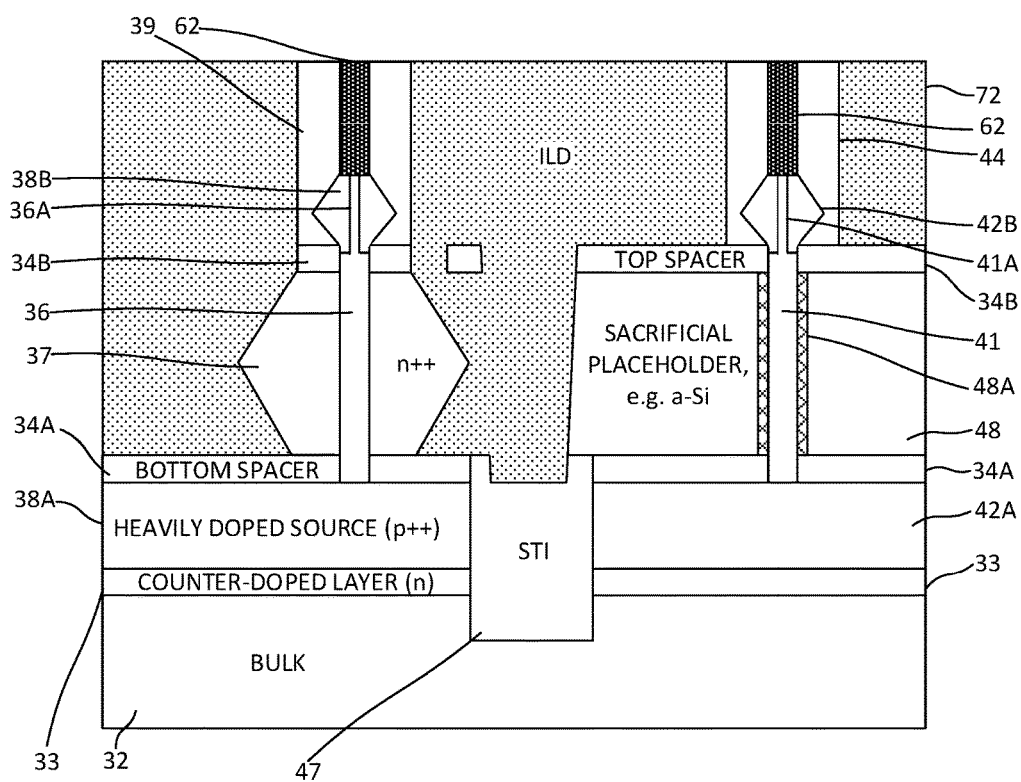

The gate 37 is an "all-around gate" that surrounds the channel 36 on all sides. The gate region can be formed by a gate-on-channel epitaxy process wherein highly doped semiconductor material forming the gate is epitaxially grown on the outer surface of the channel region. Referring to FIG. 21, given a channel surface having <110> oriented planes, a diamond shaped epitaxial gate structure will form, which is bound by <111> oriented planes. In other embodiments, dual- or tri-gate structures can be formed as an alternative to all-around gates.

The epitaxially grown gate 37 can be in-situ doped during the epitaxial growth process. An n-type dopant selected from a group V element hydride including, but not limited to, arsine ($AsH_3$), and phosphine ($PH_3$), or a p-type dopant selected from a group III element hydride, including, but not limited to, diborane gas at various concentrations may be incorporated within the gate depending on the type of JFET to be fabricated. For example, in a non-limiting example, a dopant concentration range may be $e19/cm^3$ to $e21/cm^3$, from $1e19/cm^3$ to $4e20/cm^3$ preferred. The gate 37 can include, but is not necessarily limited to, silicon (Si), silicon germanium (SiGe), or other semiconductor material.

The channel 36, as well as the source/drain regions of the JFET operatively associated therewith, have a first conductivity type, which may be either p-type or n-type. The gate 37 is doped to obtain second conductivity type, which may be either n-type or p-type, opposite to the doping of the channel 36 and the source/drain regions (e.g. regions 38A, 38B). A pn junction between the gate and the channel is thereby formed. In one embodiment, as noted hereinabove, a p-channel JFET is formed when the channel 36, source and drain have p-type conductivity and the gate 37 has n-type conductivity. In another embodiment, an n-channel junction FET is formed when the channel, source and drain are n-type and the gate is p-type.

In addition, relative to each other in terms of concentration, in accordance with an embodiment hereof, the source/drain regions 38A, 38B can be the same or more heavily doped than the semiconductor gate 37, and the gate material can be more heavily doped than the channel 36. For example, a resulting structure can have heavily doped (e.g., p++) source/drain regions 38A and 38B, a heavily doped (e.g., n++) gate 37, and a low doped (e.g., p) channel 36.

FIG. 21 shows the resulting structure 85 including the completed JFET. The structure 85 is filled with ILD material, planarized, and the hard mask 76 is removed. The structure is again planarized to obtain the structure shown in FIG. 22.

Figure 23:
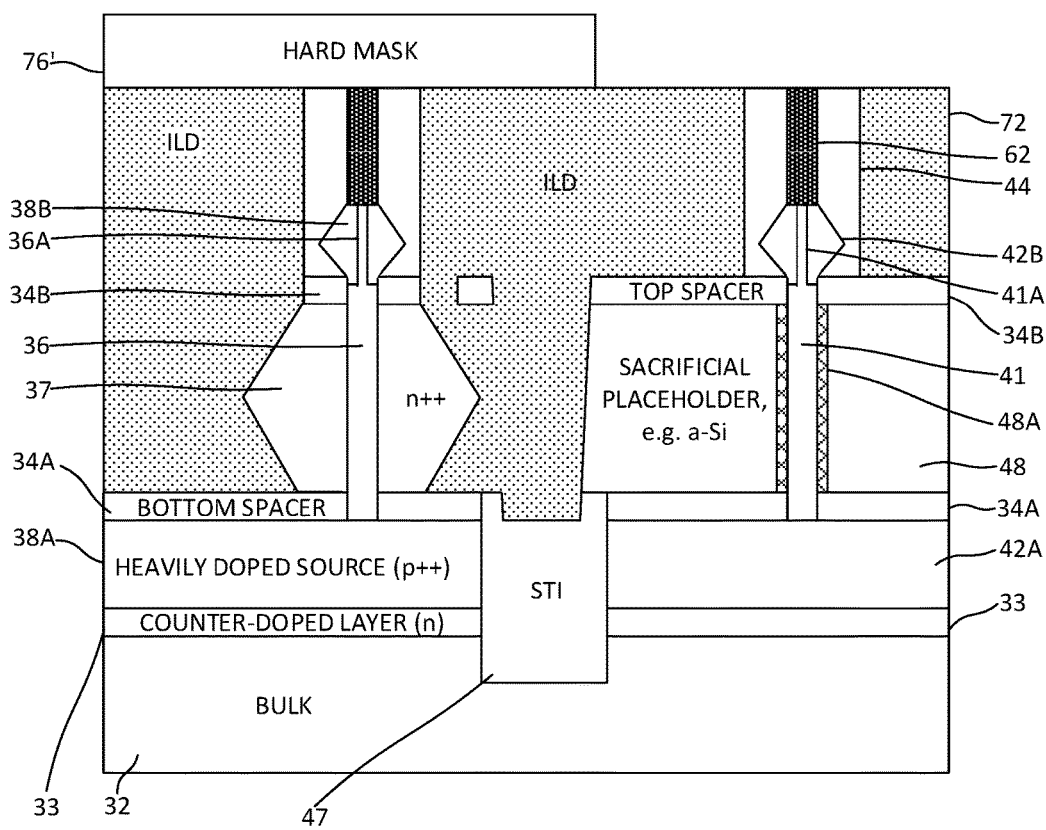
Figure 24:
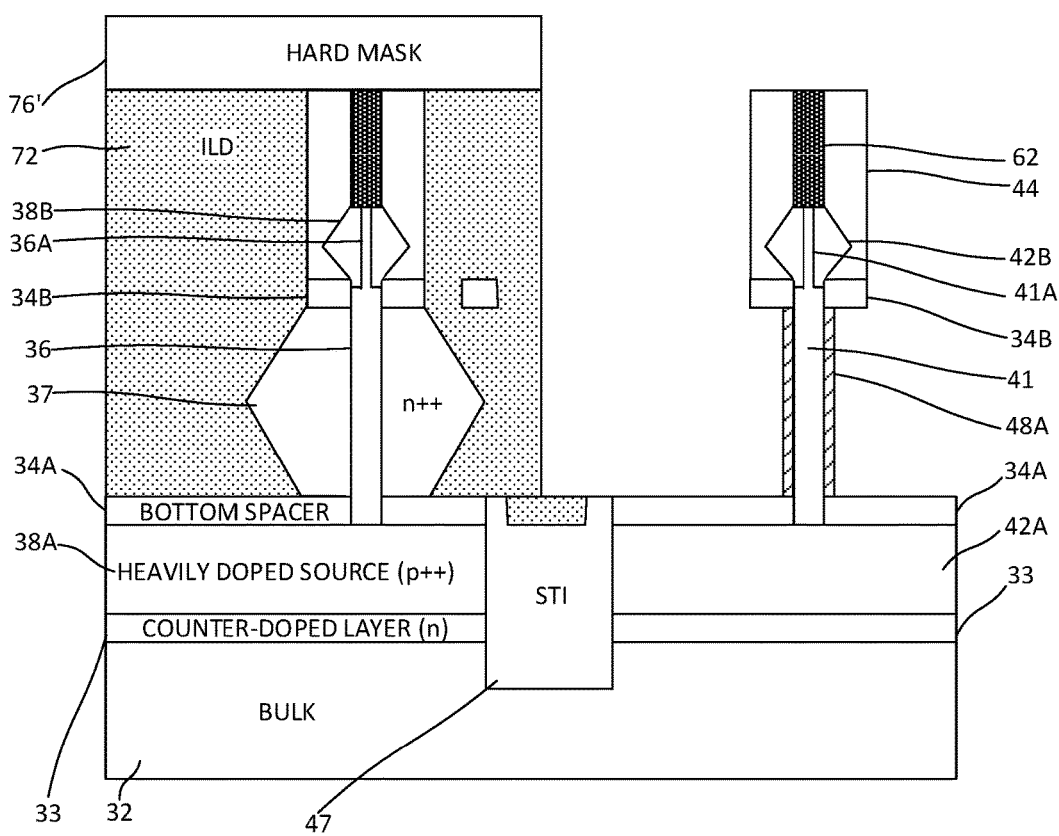

A further hard mask 76' is patterned to protect the finished JFET region, as schematically illustrated in FIG. 23. The regions of the ILD layer, the top spacer 34B, and the sacrificial placeholder layer 48 above the region to be used for MOSFET fabrication are removed by ME, stopping at the bottom spacer 34A. The vertical spacers 39 protecting the MOSFET source/drain region 42A also effectively functions as a mask during the RIE process(es). The portion of the sacrificial placeholder layer 48 in the MOSFET region beneath the vertical spacers 39 is then removed to obtain the structure illustrated in FIG. 24. In embodiments where the sacrificial placeholder layer 48 consists essentially of amorphous silicon, a wet etch using hot ammonia can be used to selectively remove the portion thereof beneath the vertical spacers, leaving the spacers 39, 34A, the oxide layer 48A, the STI region 47 and the ILD material substantially intact.

Figure 25:
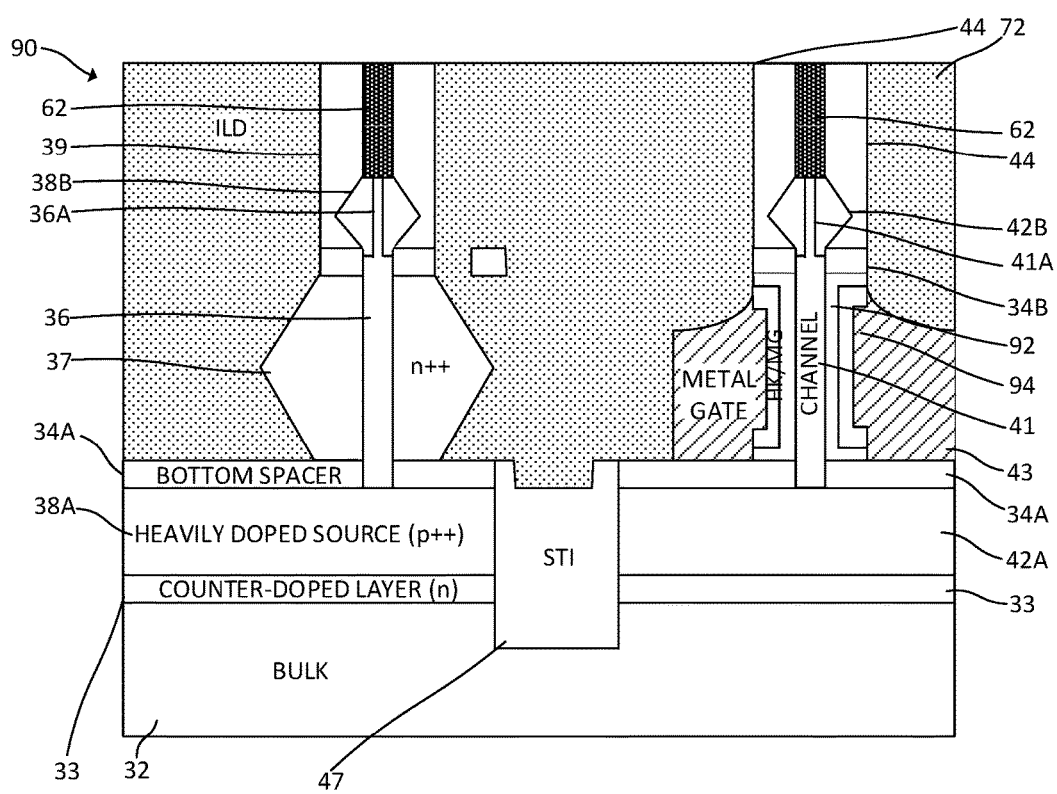

FIG. 25 is a cross-sectional view showing an exemplary monolithic structure 90 following removal of the oxide layer 48A from the MOSFET channel 41, formation of a MOSFET gate structure, and deposition of ILD material in the MOSFET region. A gate dielectric layer 92 and a work function metal layer form portions of the gate stack that replaces the portion of the sacrificial placeholder layer 48 that serves as a dummy gate for the MOSFET device. The gate dielectric layer adjoins the bottom spacer 34A, the MOSFET channel 41, and the top spacer 34B. Non-limiting examples of suitable materials for the gate dielectric layer 92 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 92 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer includes multiple layers.

The work function metal layer 94 is disposed over the gate dielectric layer 92. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

Electrically conductive metal gate material is deposited in the MOSFET region and adjoins the work function layer 94. The deposited metal gate material forms the metal gate 43 of the MOSFET device shown in FIG. 1. The metal gate 43, the work function layer 94 and the gate dielectric layer 92 form the gate stack of the MOSFET device. Non-limiting examples of suitable electrically conductive metals for forming the metal gate include aluminum (Al), platinum (Pt), gold (Au), tungsten (W), titanium (Ti), or any combination thereof. The gate metal may be deposited using processes such as CVD, PECVD, PVD, plating, thermal or e-beam evaporation, or sputtering. A planarization process, for example, chemical mechanical planarization (CMP), is performed to polish the top surface of the deposited gate metal material down to the top surfaces of the vertical spacers 39. The metal gate material is then partially recessed by a reactive ion etch process or other suitable etch process. An anisotropic etch is performed such to recess the gate dielectric layer 92 and the work function metal layer 94 down to the level of the metal gate 41. The anisotropic etch may be a RIE process. Gate lithography and etching are employed to further reduce the dimensions of the deposited metal gate material. A mask (not shown) may be disposed on the metal gate material and subsequently patterned. A portion of the metal gate material is removed, thereby defining the completed metal gate 41 as shown in FIG. 25 and FIG. 1. The gate dielectric material 1201 and work function metal 1202 are also etched during this step. A combination of RIE processes may be performed. A portion of the bottom spacer 34A is positioned between the gate stack and the heavily doped source/drain region 42A.

FIG. 25 further illustrates a planarized interlayer dielectric (ILD) layer that encapsulates the completed MOSFET device. The ILD layer may be formed from a low-k dielectric material (with k<4.0), including but not limited to, silicon oxide, spin-on-glass, a flowable oxide, a high density plasma oxide, borophosphosilicate glass (BPSG), or any combination thereof. The ILD layer 72 is deposited by any suitable process including but not limited to CVD, PVD, plasma enhanced CVD, atomic layer deposition (ALD), evaporation, chemical solution deposition, or like processes. The ILD layers formed on the MOSFET and JFET regions of the monolithic structure comprise a monolithic layer 72 protecting both devices.

Gate contacts 37A, 43A and source/drain contacts 38C, 43C are formed to obtain the monolithic structure 30 illustrated in FIG. 1 from that shown in FIG. 25. The gate contacts extend from the top surface of the ILD 96 to the gates 37, 43. The gate contacts are formed by patterning trenches in the ILD 72. A resist, such as a photoresist, may be deposited and patterned. An etch process, such as a RIE, may be performed using the patterned resist as an etch mask to remove selected portions of the ILD 96 until the gates 37, 43 are exposed. The gate contact trenches are filled with an electrically conductive material or a combination of electrically conductive materials. Gate contact material may, for example, include aluminum (Al), platinum (Pt), gold (Au), tungsten (W), titanium (Ti), or any combination thereof. The gate contact material may be deposited by, for example, CVD, PECVD, PVD, plating, thermal or e-beam evaporation, or sputtering. A planarization process, for example, CMP, is performed to remove any conductive material from the surface of the ILD 96. The source/drain contacts 38C, 43C extend between the vertical spacers 39 to the highly doped, epitaxial regions forming the source/drain regions of the JFET and MOSFET. The dielectric caps 62 are removed to form drain contact trenches. The drain contact trenches are formed using an etch process such as a RIE and patterned resist to protect other portions of the structure 90. The drain contact trenches are filled with an electrically conductive material such as aluminum (Al), platinum (Pt), gold (Au), tungsten (W), titanium (Ti), or any combination thereof. The resulting structure is then planarized to obtain the monolithic structure 30 shown in FIG. 1.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1<sup>st</sup> Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Figure 19:
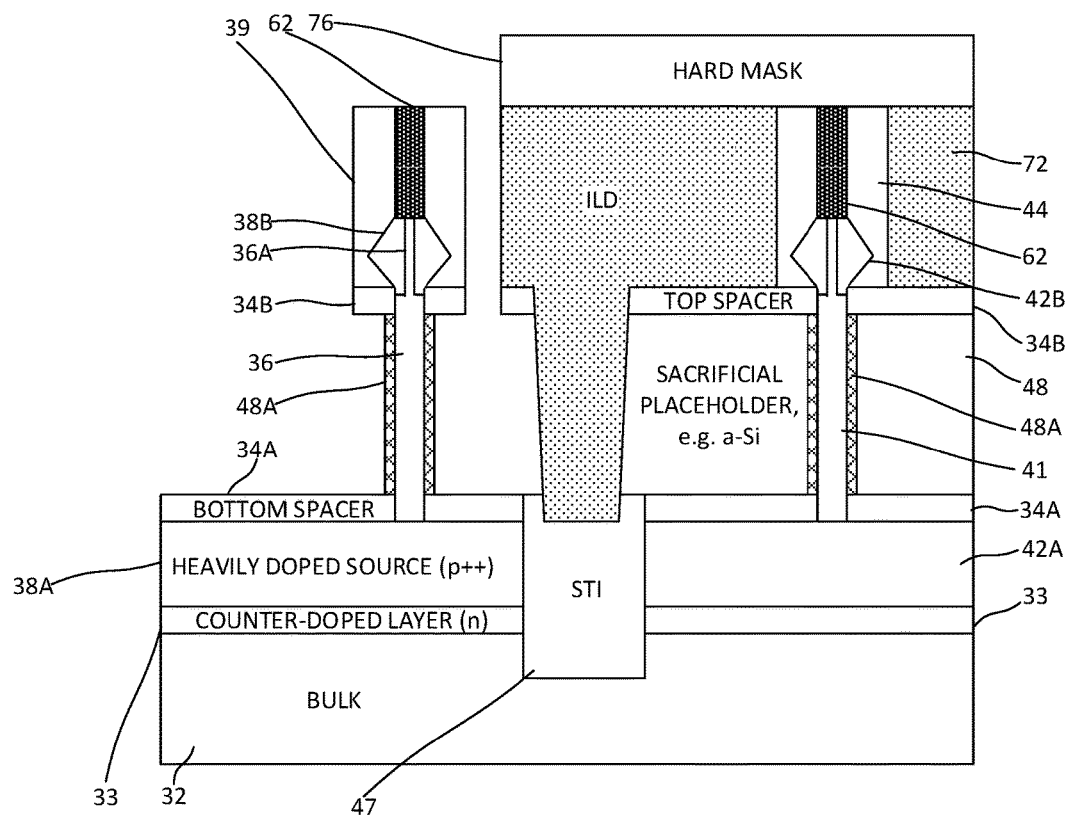

Given the discussion thus far, it will be appreciated that, in general terms, an exemplary fabrication method is provided for obtaining a monolithic structure including a vertical JFET device and a vertical MOSFET device such as those shown in FIG. 1. The method includes obtaining a first structure including a heavily doped source/drain layer 33A including first and second bottom source/drain regions 38A, 42A, an isolation region such as STI region 47 electrically isolating the first bottom source/drain region from the second bottom source/drain region, a bottom electrically insulating spacer 34A adjoining the heavily doped source/drain layer, a top electrically insulating spacer 34B above and parallel to the bottom electrically insulating spacer, and a sacrificial layer 48 between the bottom and top electrically insulating spacers. An exemplary structure including such elements is shown in FIG. 4. First and second vertical trenches 52 are formed through the bottom and top electrically insulating spacers and the sacrificial layer, as illustrated in FIGS. 7 and 8. Semiconductor channels 36, 41 are epitaxially grown within the first and second trenches such that the first semiconductor channel adjoins the first bottom source/drain region and the second semiconductor channel adjoins the second bottom source/drain region. The first semiconductor channel 36 is doped and has the same conductivity type as the bottom source/drain region 38A on which it is grown. The second semiconductor channel 41 is essentially undoped or lightly doped, though it may contain some impurities. Epitaxial channel material extensions integral with the channels extend above the top electrically insulating spacer. Heavily doped first and second top source/drain regions 38B, 42B are epitaxially grown on the first and second semiconductor channel material extensions, as schematically illustrated in FIG. 12. Following removal of a first portion of the sacrificial layer above the first bottom source/drain region, such as shown in FIGS. 18-19, a heavily doped semiconductor gate 37 is epitaxially grown on the first semiconductor channel 36 and between the bottom and top electrically insulating spacers. The heavily doped semiconductor gate 37 and the first semiconductor channel have opposite conductivity types. In one embodiment, a lightly doped channel 36 has p-type conductivity while the gate has n-type conductivity. The vertical MOSFET device is formed following removal of a second portion of the sacrificial layer above the second bottom source/drain region 42A, as shown in FIG. 25. The method may further include forming first and second vertical spacers 39 encasing, respectively, the first and second top source/drain regions as shown in FIG. 13. The first and second vertical spacers may further encase the caps 62 formed on the channel material extensions. Such caps may later be replaced with first and second source/drain contacts as shown in FIG. 1. The fabrication method can employ a bulk semiconductor substrate by using a counter-doped semiconductor layer 33 between the bulk semiconductor substrate 32 and the heavily doped source/drain layer 33A. The isolation region may be formed as a shallow trench isolation region extending through the heavily doped source/drain layer and the counter-doped semiconductor layer, thereby forming the first and second bottom source/drain regions from the heavily doped source/drain layer. It will be appreciated that the gate structure of the MOSFET device can be formed either before or after formation of the heavily doped gate of the JFET device.

Further given the above discussion, a monolithic electronic structure including vertical JFET and MOSFET devices includes a heavily doped source/drain layer including first and second bottom source/drain regions 38A, 42A, the first and second bottom source/drain regions being electrically isolated from each other. The vertical junction field-effect transistor includes a doped first semiconductor channel 36, a heavily doped first top source/drain region 38B, a heavily doped semiconductor gate 37 adjoining the first semiconductor channel, and the first bottom source/drain region 38A. The conductivity type of the semiconductor gate is opposite to the conductivity type of the semiconductor channel 36, the gate being n++ and the channel p in some embodiments. The vertical metal-oxide-semiconductor field-effect transistor includes a second semiconductor channel 41, a heavily doped second top source/drain region 42B, a gate dielectric layer adjoining the first semiconductor channel, a metal gate 43 over the gate dielectric layer, and the second bottom source/drain region 42A. The second top source/drain region 42B and the second bottom source/drain region 42A have the same conductivity type as the first top source/drain region 38B and the first bottom source/drain region 38A of the JFET device. The JFET and MOSFET devices can be supported by a bulk semiconductor substrate 32 with a counter-doped layer 33 positioned between the bulk semiconductor substrate and the heavily doped source/drain layer 33A (which includes the bottom source/drain regions 38A, 42A of the JFET and MOSFET devices). A shallow trench isolation region 47 extends through the heavily doped source/drain layer 33A and the counter-doped layer 33 and electrically isolates the first bottom source/drain region from the second bottom source/drain region.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this disclosure.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having low-noise devices therein.

An integrated circuit in accordance with aspects of the present disclosure can be employed in essentially any application and/or electronic system where noise reduction would be beneficial. Given the teachings of the present disclosure provided herein, one of ordinary skill in the art will be able to contemplate other implementations and applications of embodiments disclosed herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "on" or "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method of fabricating a monolithic semiconductor structure including a vertical JFET device and a vertical MOSFET device, the method comprising:
   obtaining a first structure including:
      a heavily doped source/drain layer including first and second bottom source/drain regions,
      an isolation region electrically isolating the first bottom source/drain region from the second bottom source/drain region,
      a bottom electrically insulating spacer above the heavily doped source/drain layer,
      a top electrically insulating spacer above and parallel to the bottom electrically insulating spacer, and
      a sacrificial layer between the bottom and top electrically insulating spacers;
   forming first and second vertical trenches, each of the first and second vertical trenches extending through the bottom and top electrically insulating spacers and the sacrificial layer;
   epitaxially growing first and second semiconductor channels and first and second channel material extensions, the first and second semiconductor channels being grown within the first and second trenches such that the first semiconductor channel is doped and adjoins the first bottom source/drain region, the second semiconductor channel adjoins the second bottom source/drain region, and the first and second channel material extensions are integral, respectively, with the first and second semiconductor channels and extend above the top electrically insulating spacer;
   epitaxially growing heavily doped first and second top source/drain regions, respectively, on the first and second channel material extensions;
   removing a first portion of the sacrificial layer above the first bottom source/drain region;
   epitaxially growing a heavily doped semiconductor gate on the first semiconductor channel and between the bottom and top electrically insulating spacers, the heavily doped semiconductor gate and the first semiconductor channel having opposite conductivity types;
   removing a second portion of the sacrificial layer above the second bottom source/drain region;
   forming a gate dielectric layer on the second semiconductor channel between the bottom and top electrically insulating spacers, and
   forming a metal gate over the gate dielectric layer.

2. The method of claim 1, further including forming first and second vertical spacers encasing, respectively, the first and second top source/drain regions.

3. The method of claim 2, further including:
   forming first and second caps, respectively, on the first and second channel material extensions, further wherein forming the first and second vertical spacers further includes encasing the first and second caps, and
   replacing the first and second caps with first and second source/drain contacts.

4. The method of claim 3, wherein obtaining the first structure includes:
   obtaining a layered structure including:
      a bulk semiconductor substrate,
      the heavily doped source/drain layer, a counter-doped semiconductor layer between the bulk semiconductor substrate and the heavily doped source/drain layer, the counter-doped semiconductor layer and the heavily doped source/drain layer having opposite conductivity types, and the bottom electrically insulating spacer; and forming the isolation region as a shallow trench isolation region extending through the heavily doped source/drain layer and the counter-doped semiconductor layer, thereby forming the first and second bottom source/drain regions from the heavily doped source/drain layer.

5. The method of claim 4, further including:

depositing the sacrificial layer over the bottom electrically insulating spacer and the shallow trench isolation region;

depositing the top electrically insulating spacer on the sacrificial layer, and depositing an oxide layer over the top electrically insulating spacer;

further including forming the first and second vertical trenches through the oxide layer.

6. The method of claim 5, further including:

forming a third vertical trench through the top and bottom electrically insulating spacers and the sacrificial layer down to the shallow trench isolation region;

filling the third vertical trench with a dielectric material, and further wherein removing the first portion of the sacrificial layer includes etching the first portion of the sacrificial layer selective to the dielectric material within the third vertical trench.

7. The method of claim 1, wherein the heavily doped source/drain layer consists essentially of silicon, silicon germanium, or germanium and has p-type conductivity, and further wherein the first semiconductor channel has p-type conductivity.

8. The method of claim 1, wherein epitaxially growing the heavily doped first and second top source/drain regions is conducted simultaneously.

9. The method of claim 1, wherein epitaxially growing the heavily doped semiconductor gate causes contacting of the heavily doped semiconductor gate with the bottom and top electrically insulating spacers.

10. The method of claim 9, wherein the bottom and top electrically insulating spacers consist essentially of silicon nitride and the sacrificial layer consists essentially of amorphous silicon.

* * * * *